(12) United States Patent
Ren et al.

(10) Patent No.: US 12,396,355 B2
(45) Date of Patent: Aug. 19, 2025

(54) DISPLAY PANEL AND DISPLAY APPARATUS INCLUDING PHOTOELECTRIC SENSING STRUCTURE AND COLLIMATION LIGHT PATH STRUCTURE CONFIGURED TO AVOID CROSSTALK

(71) Applicants: Chengdu BOE Optoelectronics Technology Co., Ltd., Sichuan (CN); BOE TECHNOLOGY GROUP CO., LTD., Beijing (CN)

(72) Inventors: Huaisen Ren, Beijing (CN); Changlong Yuan, Beijing (CN); Peng Hou, Beijing (CN); Tao Gao, Beijing (CN); Wei Xia, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 493 days.

(21) Appl. No.: 17/802,556

(22) PCT Filed: Oct. 28, 2021

(86) PCT No.: PCT/CN2021/126963
§ 371 (c)(1),
(2) Date: Aug. 26, 2022

(87) PCT Pub. No.: WO2022/156299
PCT Pub. Date: Jul. 28, 2022

(65) Prior Publication Data
US 2023/0142687 A1    May 11, 2023

(30) Foreign Application Priority Data

Jan. 20, 2021  (CN) .......................... 202110073550.6

(51) Int. Cl.
*H10K 59/60*    (2023.01)
*H10K 59/121*   (2023.01)
(Continued)

(52) U.S. Cl.
CPC ......... *H10K 59/60* (2023.02); *H10K 59/1213* (2023.02); *H10K 59/122* (2023.02);
(Continued)

(58) Field of Classification Search
CPC ............ H10K 59/1213; H10K 59/122; H10K 59/131; H10K 59/38; H10K 59/40; H10K 59/60; H10K 59/8792
(Continued)

(56) References Cited

FOREIGN PATENT DOCUMENTS

| CN | 110110659 A | * | 8/2019 | ......... G06V 40/1318 |
| CN | 110399797 A | * | 11/2019 | ........... G06K 9/0004 |

(Continued)

*Primary Examiner* — Matthew E. Gordon
(74) *Attorney, Agent, or Firm* — HOUTTEMAN LAW LLC

(57) ABSTRACT

The present disclosure provides a display panel, including: a base; a light-emitting structure on the base; a package layer on the light-emitting structure; a photoelectric sensing structure on the package layer; at least one of a touch functional layer or a color filter layer on the package layer, where the touch functional layer includes a first metal layer structure, a touch insulation layer and a second metal layer structure, and the color filter layer includes a black matrix; a collimation light path structure on the photoelectric sensing structure and including at least two light-blocking layers, where each light-blocking layer has light-transmitting holes and the at least two light-blocking layers include at least one first light-blocking layer, and the first light-blocking layer is disposed in the same layer as the first metal layer structure, the second metal layer structure, the touch insulation layer or the black matrix.

16 Claims, 17 Drawing Sheets

(51) Int. Cl.
 *H10K 59/122* (2023.01)
 *H10K 59/38* (2023.01)
 *H10K 59/40* (2023.01)
 *H10K 59/80* (2023.01)

(52) U.S. Cl.
 CPC ............ *H10K 59/38* (2023.02); *H10K 59/40* (2023.02); *H10K 59/8792* (2023.02)

(58) Field of Classification Search
 USPC .......................................................... 257/40
 See application file for complete search history.

(56) References Cited

FOREIGN PATENT DOCUMENTS

| | | | | |
|---|---|---|---|---|
| CN | 111584592 A | | 8/2020 | |
| CN | 111965904 A | * | 11/2020 | ....... G02F 1/134309 |
| CN | 112861651 A | | 5/2021 | |
| WO | WO2018176852 A1 | | 10/2018 | |

\* cited by examiner

DISPLAY PANEL AND DISPLAY APPARATUS INCLUDING PHOTOELECTRIC SENSING STRUCTURE AND COLLIMATION LIGHT PATH STRUCTURE CONFIGURED TO AVOID CROSSTALK

TECHNICAL FIELD

The present disclosure generally relates to the field of display technology, and in particular, relates to a display panel and a display apparatus.

BACKGROUND

In order to enable a texture recognition function of a display product, some manufacturers propose a solution of combining a photoelectric sensor with a display panel, with the principle of texture recognition as follows: the display panel emits light, and the photoelectric sensor receives light reflected from valley or ridge positions of a fingerprint and generates corresponding electric signals; since the reflection at the valley positions and the reflection at the ridge positions are different, the generated electric signals are also different, thereby implementing recognition of valleys and ridges.

However, it is found in practical applications that, due to the influence of stray light at relatively large angles, crosstalk of light reflected by adjacent valley or ridge positions, and the like, imaging is usually caused to be blurred.

SUMMARY

To solve at least one of problems in the related art, the present disclosure provides a display panel and a display apparatus.

In a first aspect, an embodiment of the present disclosure provides a display panel, including:
  a base;
  a light-emitting structure on a side of the base;
  a package layer on a side of the light-emitting structure facing away from the base;
  a photoelectric sensing structure on a side of the package layer facing the base;
  at least one of a touch functional layer or a color filter layer on a side of the package layer facing away from the base, where the touch functional layer includes a first metal layer structure, a touch insulation layer and a second metal layer structure stacked in a normal direction of a plane where the base is located, and the color filter layer includes a black matrix; and
  a collimation light path structure on a side of the photoelectric sensing structure facing away from the base, the collimation light path structure including at least two light-blocking layers stacked in the normal direction of the plane where the base is located, where each light-blocking layer has light-transmitting holes arranged in an array, and orthographic projections of the light-transmitting holes in different light-blocking layers on the base at least partially coincide with each other, the at least two light-blocking layers include at least one first light-blocking layer on a side of the package layer facing away from the base, and the first light-blocking layer is disposed in the same layer as the first metal layer structure, the touch insulation layer, the second metal layer structure or the black matrix.

In some implementations, the light-emitting structure includes a plurality of light-emitting elements, each light-emitting element includes a first electrode, an organic functional layer and a second electrode stacked in the normal direction of the plane where the base is located, and the organic functional layer includes at least a light-emitting layer, and
  the display panel further includes:
    a driver circuit layer between the base and the light-emitting structure, the driver circuit layer including a first transistor electrically connected to the light-emitting element, where a drain of the first transistor is electrically connected to the first electrode in the light-emitting element corresponding to the first transistor.

In some implementations, the photoelectric sensing structure includes at least one photoelectric sensor, each photoelectric sensor includes a third electrode, a fourth electrode, and a photosensitive layer between the third electrode and the fourth electrode;
  the light-emitting element and the photoelectric sensor are located on a same side of the base, and the driver circuit layer further includes a second transistor electrically connected to the photoelectric sensor, where a drain of the second transistor is electrically connected to the third electrode in the photoelectric sensor corresponding to the second transistor.

In some implementations, the display panel further includes:
  a planarization layer between the first electrode and the thin film transistor, where the first electrode is electrically connected to the drain of the first transistor corresponding to the first electrode, through a via hole in the planarization layer; and
  a pixel defining layer on a side of the first electrode facing away from the base, where the pixel defining layer is provided with a plurality of pixel openings, and the light-emitting elements are located in the pixel openings.

In some implementations, the light-emitting element and the photoelectric sensor are located on a same side of the base, and a distance from a side surface of the light-emitting layer facing away from the base to the base is greater than or equal to a distance from a side surface of the photosensitive layer facing away from the base to the base.

In some implementations, the distance from the side surface of the photosensitive layer facing away from the base to the base is smaller than a distance from a side surface of the planarization layer facing away from the base to the base; and
  the at least two light-blocking layers further include at least one second light-blocking layer on a side of the package layer facing the base, where each second light-blocking layer satisfies:
  the pixel defining layer is made of a material including a black resin material, and the pixel defining layer also serves as the second light-blocking layer;
  or the first electrode is made of a metal material, and the second light-blocking layer is disposed in the same layer as the first electrode;
  or the planarization layer is made of a black resin material, and the planarization layer also serves as the second light-blocking layer.

In some implementations, a plane where a side surface of the photosensitive layer facing away from the base is located is between the drain of the first transistor and the base;
  the at least two light-blocking layers further include at least one second light-blocking layer on a side of the package layer facing the base, where each second light-blocking layer satisfies:

the pixel defining layer is made of a material including a black resin material, and the pixel defining layer also serves as the second light-blocking layer;

or the first electrode is made of a metal material, and the second light-blocking layer is disposed in the same layer as the first electrode;

or the planarization layer is made of a black resin material, and the planarization layer also serves as the second light-blocking layer;

or the drain of the first transistor is made of a metal material, and the second light-blocking layer is disposed in the same layer as the drain of the first transistor.

In some implementations, the light-emitting structure and the photoelectric sensing structure are on opposite sides of the base.

In some implementations, the at least two light-blocking layers further include at least one second light-blocking layer on a side of the package layer facing the base, where the second light-blocking layer satisfies:

the pixel defining layer is made of a material including a black resin material, and the pixel defining layer also serves as the second light-blocking layer;

or the first electrode is made of a metal material, and the second light-blocking layer is disposed in the same layer as the first electrode;

or the planarization layer is made of a black resin material, and the planarization layer also serves as the second light-blocking layer;

or the drain of the first transistor is made of a metal material, and the second light-blocking layer is disposed in the same layer as the drain of the first transistor.

In some implementations, the black matrix has two layers stacked in the normal direction of the base.

In some implementations, the light-transmitting holes in the light-blocking layers of the collimation light path structure have a same shape and a same aperture.

In some implementations, an orthographic projection of each light-transmitting hole, in each light-blocking layer, on the base is completely coincident with an orthographic projection of the light-transmitting hole corresponding to said each light-transmitting hole, in another light-blocking layer, on the base.

In some implementations, the light-transmitting hole has an aperture D, and in the collimation light path structure, a distance from a side surface of the light-blocking layer, closest to the base, facing the base to a side surface of the light-blocking layer, farthest from the base, facing away from the base is H, and arctan(D/H) takes a value in a range of [10°, 20°].

In some implementations, each light-transmitting hole in each light-blocking layer and the light-transmitting hole, corresponding to said each light-transmitting hole, in another light-blocking layer define a collimation light-transmitting channel; and the collimation light-transmitting channel has a collimation light-receiving angle in a range of [10°, 20°].

In some implementations, the number of light-blocking layers in the collimation light path structure is less than or equal to 4.

In a second aspect, an embodiment of the present disclosure further provides a display apparatus, including the display panel as described in the first aspect.

DETAIL DESCRIPTION OF EMBODIMENTS

To improve understanding of the technical solutions of the present disclosure for those skilled in the art, the display panel and the display apparatus provided in the present disclosure will be described below in detail in conjunction with the accompanying drawings.

Figure 1:
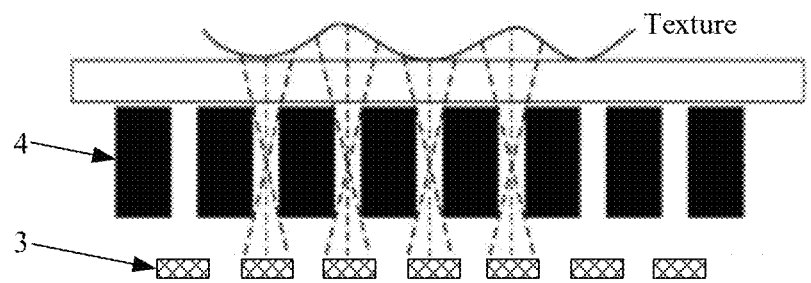
FIG. 1 is a schematic structural diagram of a display panel in the related art.

FIG. 1 is a schematic structural diagram of a display panel in the related art. As shown in FIG. 1, in the related art, to solve the problem of blurry imaging due to the influence of stray light with relatively large angles, crosstalk of light reflected by adjacent valley or ridge positions, and the like, a collimation light path structure 4 is typically disposed on a light incident side of a photoelectric sensor 3. The collimation light path structure 4 is generally formed by a layer of relatively thick collimation film provided with a plurality of light-transmitting channels. Light emitted to the collimation light path structure 4 can only be emitted, through the light-transmitting channels, to the photoelectric sensor 3, and through the collimation processing by the collimation film, the stray light with relatively large angles can be filtered out, and crosstalk of light reflected by adjacent valley or ridge positions can be avoided.

However, in practical production, it is found that the collimation light path structure 4 formed by the single layer of relatively thick collimation film is difficult to be manufactured and integrated into a display panel. In order to solve the above technical problems, embodiments of the present disclosure provide corresponding solutions.

Figure 2:
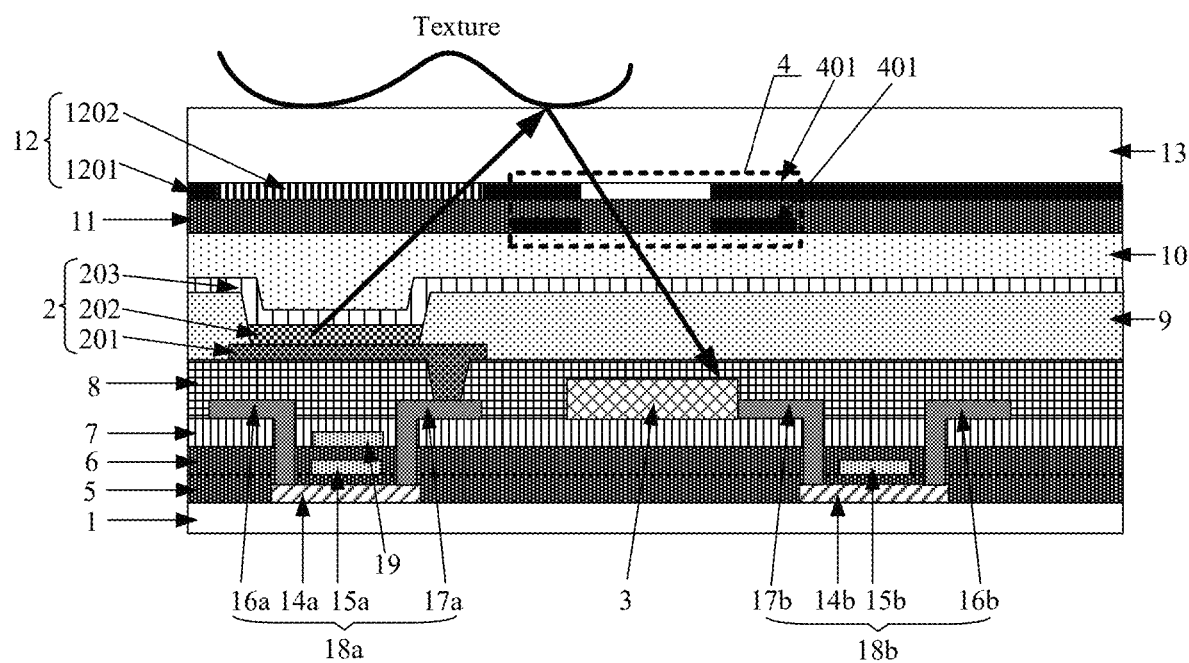
FIG. 2 is a schematic sectional view of a display panel in an embodiment of the present disclosure.
Figure 3:
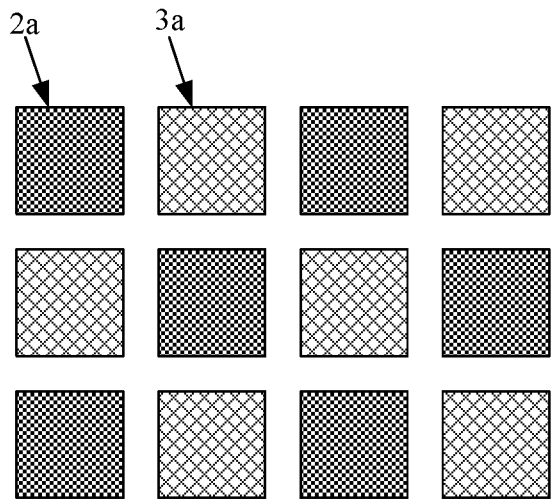
FIG. 3 is a schematic top view of a light-emitting element and a photoelectric sensor in an embodiment of the present disclosure.
Figure 4A:
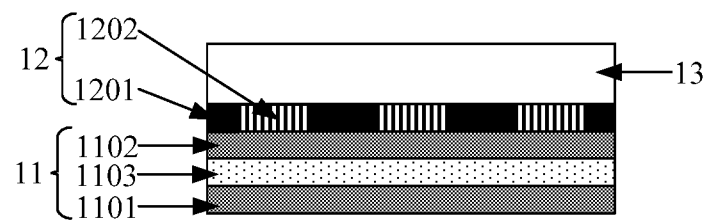
FIG. 4*a* is a schematic structural diagram of a touch functional layer and a color filter layer in an embodiment of the present disclosure.
Figure 4B:
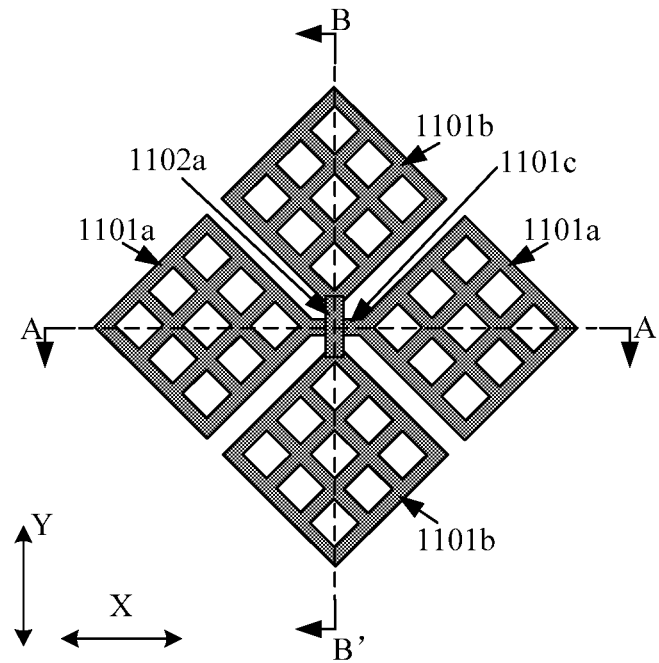
FIG. 4*b* is a schematic partial top view of a first metal layer structure and a second metal layer structure in an embodiment of the present disclosure.
Figure 4C:
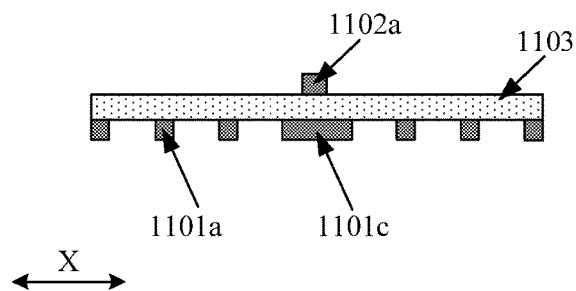
FIG. 4*c* is a schematic sectional view taken along line A-A' in FIG. 4*b*.
Figure 4D:
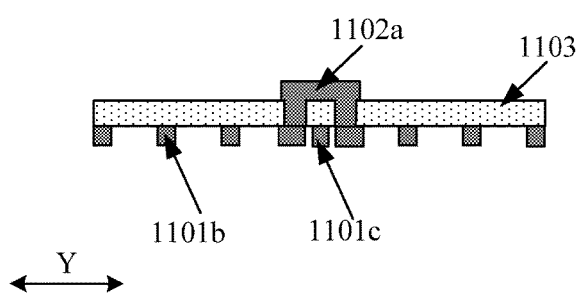
FIG. 4*d* is a schematic sectional view taken along line B-B' in FIG. 4*b*.

FIG. 2 is a schematic sectional view of a display panel in an embodiment of the present disclosure, FIG. 3 is a schematic top view of a light-emitting element and a photoelectric sensor in an embodiment of the present disclosure, FIG. 4a is a schematic structural diagram of a touch functional layer and a color filter layer in an embodiment of the present disclosure, FIG. 4b is a schematic partial top view of a first metal layer structure and a second metal layer structure in an embodiment of the present disclosure, FIG. 4c is a schematic sectional view taken along line A-A' in FIG. 4b, and FIG. 4d is a schematic sectional view taken along line B-B' in FIG. 4b. As shown in FIGS. 2 to 4d, the display panel includes: a base 1, a light-emitting structure, a package layer 10, and a photoelectric sensing structure. The base 1 may be made of a material including polyimide (PI) or glass. The light-emitting structure includes a plurality of light-emitting elements 2, each light-emitting element includes a first electrode 201, an organic functional layer and a second electrode 203 stacked in the normal direction of the plane where the base 1 is located. The organic functional layer includes at least a light-emitting layer 202. The package layer 10 is located on a side of the light-emitting structure facing away from the base 1, and generally includes inorganic package layers and organic package layers alternately disposed (e.g., a three-layer stacked structure composed of an inorganic package layer, an organic package layer, and an inorganic package layer). The photoelectric sensing structure is located on a side of the package layer 10 facing the base 1. The photoelectric sensing structure includes at least one photoelectric sensor 3, and each photoelectric sensor 3 includes a third electrode 301, a fourth electrode 303, and a photosensitive layer 302 between the third electrode 301 and the fourth electrode 303.

In an embodiment of the present disclosure, the display panel further includes: at least one of a touch functional layer 11 or a color filter layer 12, and a collimation light path structure 4.

The touch functional layer 11 and the color filter layer 12 are both located on a side of the package layer 10 facing away from the base 1. The touch functional layer 11 includes a first metal layer structure 1101, a touch insulation layer 1103 and a second metal layer structure 1102 stacked in a normal direction of a plane where the base 1 is located. The color filter layer 12 includes a black matrix 1201.

The collimation light path structure 4 is located on a side of the photoelectric sensing structure facing away from the base 1, and configured to collimate light on a side of the photoelectric sensing structure facing away from the base 1 and emitted to the photoelectric sensing structure. The collimation light path structure 4 includes at least two light-blocking layers stacked in the normal direction of the plane where the base 1 is located. Each light-blocking layer has light-transmitting holes arranged in an array, and the light-transmitting holes in different light-blocking layers are in correspondence one to one and have orthographic projections on the base 1 which at least partially coincide with each other. The at least two light-blocking layers include at least one first light-blocking layer 401 on a side of the package layer 10 facing away from the base 1, and the first light-blocking layer 401 is disposed in the same layer as the first metal layer structure 1101, the second metal layer structure 1102, the touch insulation layer 1103 or the black matrix 1201.

It should be noted that in the embodiment of the present disclosure, the arrangement of two structures in a same layer specifically means that the two structures may be prepared from a same material film layer, and thus are located in a same film layer and made of a same material. The distances between one of the two structures in the same layer and the base 1 and between the other of the two structures in the same layer and the base 1 may be the same or different.

In an embodiment of the present disclosure, the first metal layer structure 1101 and the second metal layer structure 1102 are made of a metal material. The metal material has a certain thickness and a light-blocking effect. The touch insulation layer 1103 may be made of an organic insulating material, such as a black resin material having a light-blocking effect. When the touch insulation layer 1103 is made of a black resin material having a light-blocking effect, in order to ensure normal light emission of the light-emitting element 2, the touch insulation layer 1103 does not cover a region where the light-emitting element 2 is located. The black matrix is made of a black resin material and has a certain light-blocking effect. Therefore, each first light-blocking layer 401 in the present application may be disposed in the same layer as one of the first metal layer structure 1101, the second metal layer structure 1102, the touch insulation layer 1103 or the black matrix 1201. In addition, when no first light-blocking layer is disposed in the same layer as the touch insulation layer 1103, the touch insulation layer may be made of an organic material or inorganic material with a light-transmitting effect.

In an embodiment of the present disclosure, in the collimation light path structure 4, each light-transmitting hole in each light-blocking layer and the light-transmitting hole, corresponding to said each light-transmitting hole, in another light-blocking layer define a collimation light-transmitting channel. Therefore, the collimation light path structure 4 includes a plurality of collimation light-transmitting channels, and each collimation light-transmitting channel corresponds to one photoelectric sensor 3. The fact that the collimation light-transmitting channel corresponds to the photoelectric sensor 3 indicates that: after passing through a certain light-transmitting channel, the light reflected by the texture can reach only the photoelectric sensor 3 corresponding to the certain light-transmitting channel, rather than other photoelectric sensors 3. In an embodiment of the present disclosure, in order to avoid crosstalk of light, each light-transmitting channel may correspond to only one photoelectric sensor 3, while each photoelectric sensor 3 may correspond to one or more light-transmitting channels. The figures merely show the case where the photoelectric sensors 3 and the light-transmitting channels are in correspondence one to one as an example, which is merely exemplary, and does not result in any limitation to the technical solution of the present disclosure.

In an embodiment of the present disclosure, the collimation light path structure 4 is composed of at least two light-blocking layers, and while ensuring the same collimation effect as the single-layer collimation film in the related art, the thickness of each light-blocking layer in the embodiment of the present disclosure is smaller than that of the collimation film in the related art. Therefore, the collimation light path structure 4 in the embodiment of the present disclosure is convenient to be prepared. Meanwhile, since the collimation light path structure 4 includes at least one first light-blocking layer 401 that is disposed in the same layer as the first metal layer structure 1101, the second metal layer structure 1102, or the touch insulation layer 1103 in the touch functional layer 11, or the black matrix 1201 in the color filter layer 12, the first light-blocking layer 401 can be prepared through the preparation process of the first metal layer structure 1101, the second metal layer structure 1102, the touch insulation layer 1103 or the black matrix 1201. Therefore, no additional preparation process for the first light-blocking layer 401 is required.

It should be noted that FIG. 2 exemplarily illustrates a case where the display panel includes both the touch functional layer 11 and the color filter layer 12, and the color filter layer 12 is located on a side of the touch functional layer 11 facing away from the base 1. In an embodiment of the present disclosure, the display panel may include the touch functional layer 11 but not include the color filter layer 12, or include the color filter layer 12 but not include the touch functional layer 11, or include both the touch functional layer 11 and the color filter layer 12 and the color filter layer 12 is located on a side of the touch functional layer 11 facing the base 1. These cases all fall in the scope of the present disclosure.

In an embodiment of the present disclosure, the light-emitting element 2 is located in a pixel region 2a, the photoelectric sensor 3 is located in a detection region 3a, a plurality of pixel regions 2a are arranged in an array, a plurality of detection regions 3a are arranged in an array, and the pixel regions 2a and the detection regions 3a are alternately arranged in a row direction of the array and in a column direction of the array.

With continued reference to FIGS. 4a to 4d, in the touch functional layer 11, the first metal layer structure 1101 generally includes a plurality of first touch electrodes arranged in a first direction Y, and a plurality of second touch electrodes arranged in a second direction X. Each first touch electrode includes a plurality of first touch sub-electrodes 1101a arranged in the second direction X, and a first connecting electrode 1101c that connects any two adjacent first touch sub-electrodes 1101a in the second direction X, and each second touch electrode includes a plurality of second touch sub-electrodes 1101b arranged in the first direction Y. The second metal layer structure 1102 includes a second connecting electrode 1102a that connects any two adjacent second touch sub-electrodes 1101b in the first direction Y through a via hole in the touch insulation layer 1103. In order to prevent the first touch sub-electrodes 1101a and the second touch sub-electrodes 1101b from blocking the light emitted from the light-emitting element 2, the first touch sub-electrodes 1101a and the second touch sub-electrodes 1101b are grid electrodes, and have a hollow structure in the pixel region 2a where the light-emitting element 2 is located. It should be noted that the patterns of the touch sub-electrodes and the connecting electrodes are not shown in FIG. 2. It should be noted that FIGS. 4c and 4d merely exemplarily show the case where the second connecting electrode 1102a is located above the first touch sub-electrodes 1101a and the second touch sub-electrodes 1101b. In an embodiment of the present disclosure, it is feasible that the second connecting electrode 1102a is located below the first touch sub-electrodes 1101a and the second touch sub-electrodes 1101b, for which no corresponding figure is given.

The color filter layer 12 includes not only the black matrix 1201, but also a color filter film 1202, and the color filter film 1202 may be configured to improve light emission purity of each pixel unit in the display panel, which is beneficial to improving a color gamut of the product.

In some implementations, the display panel further includes a protective layer 13 on a side of the color filter layer 12 facing away from the base 1, and the protective layer 13 may be made of a material including polyimide (PI) or glass.

In some implementations, the light-emitting element 2 and the photoelectric sensor 3 are located on a same side of the base 1, and a distance from a side surface of the light-emitting layer 202 facing away from the base 1 to the base 1 is greater than or equal to a distance from a side surface of the photosensitive layer 302 facing away from the base 1 to the base 1. Alternatively, the light-emitting element 2 and the photoelectric sensor 3 are located on opposite sides of the base 1. Some cases where the photoelectric sensor 3 is located at different positions of the display panel will be described in detail later with reference to the accompanying drawings.

In some implementations, the display panel further includes: a driver circuit layer between the base 1 and the light-emitting structure. The driver circuit layer includes a first transistor 18a electrically connected to the light-emitting element 2. A drain 17a of the first transistor 18a is electrically connected to the first electrode 201 in the light-emitting element 2 corresponding to the first transistor 18a.

In some implementations, the driver circuit layer includes an active layer, a first gate insulation layer 5, a first gate metal layer, a second gate insulation layer 6, a second gate metal layer, an interlayer dielectric layer 7, and a source-drain metal layer, which are sequentially disposed along a direction away from the base 1. The active layer includes an active pattern 14a of the first transistor 18a, the first gate metal layer includes a pattern of a gate 15a of the first transistor 18a, the second gate metal layer includes at least a capacitor electrode 19 (the first gate metal layer and the second gate metal layer may further include other conductive structures, such as signal wires, various electrodes, and the like), and a storage capacitor may be formed between the capacitor electrode 19 and the gate of the transistor, and the source-drain metal layer includes a pattern of a source 16a and a pattern of a drain of the first transistor 18a. In some implementations, a buffer layer is provided between the active layer and the base 1.

In some implementations, the display panel further includes: a planarization layer 8 and a pixel defining layer 9. The planarization layer 8 is located between the first electrode 201 of the light-emitting element 2 and the thin film transistor, and the first electrode 201 of the light-emitting element 2 is electrically connected to the drain 17a of the first transistor 18a, corresponding to the light-emitting element 2, through a via hole in the planarization layer 8. The pixel defining layer 9 is located on a side of the first electrode 201 of the light-emitting element 2 facing away from the base 1, and has a plurality of pixel openings. The light-emitting elements 2 are located in the pixel openings.

In some implementations, a support dam (not shown) surrounding the pixel openings is provided on a side of the pixel defining layer 9 facing away from the base 1. The support dam is disposed between adjacent pixel openings, and, on one hand, can support a fine metal mask (FMM) for evaporating a light-emitting layer in the evaporation process, and on the other hand, can avoid color mixing in evaporation of the light-emitting layer.

In some implementations, the light-emitting element 2 and the photoelectric sensor 3 are located on a same side of the base 1. The driver circuit layer further includes a second transistor 18b electrically connected to the photoelectric sensor 3. A drain 17b of the second transistor 18b is electrically connected to the third electrode 301 in the photoelectric sensor 3 corresponding to the second transistor 18b. In some implementations, the active layer further includes an active pattern 14b of the second transistor 18b, the first gate metal layer further includes a pattern of a gate 15b of the second transistor 18b, and the source-drain metal layer further includes a pattern of a source 16b and a pattern of a drain 17b of the second transistor 18b.

Figure 5:
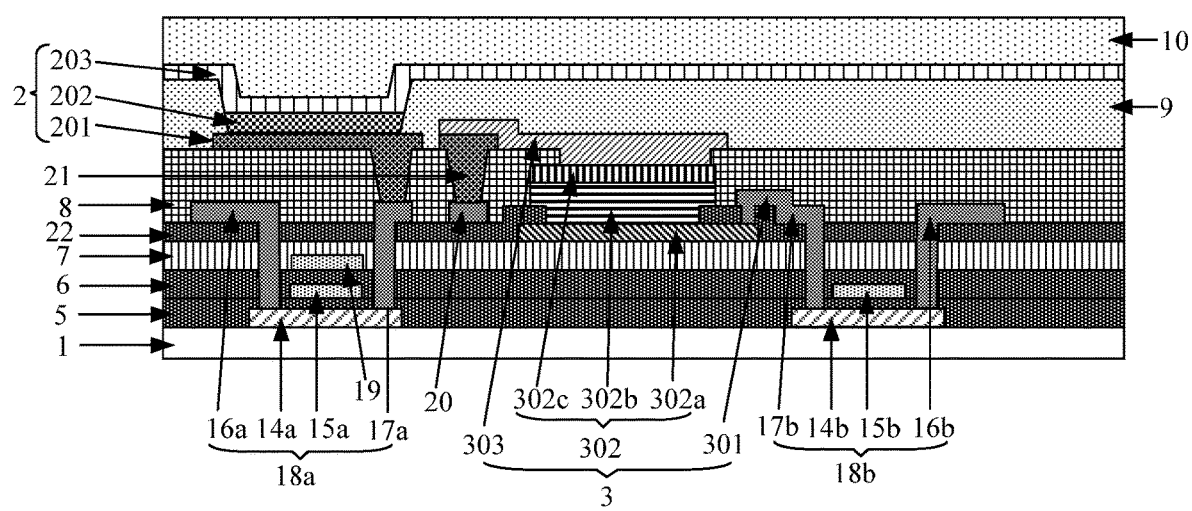
FIG. 5 is a schematic structural diagram of a light-emitting element and a photoelectric sensor in an embodiment of the present disclosure.

FIG. 5 is a schematic structural diagram of a light-emitting element and a photoelectric sensor in an embodiment of the present disclosure. As shown in FIG. 5, in the case shown in FIG. 5, the light-emitting element 2 and the photoelectric sensor 3 are located on a same side of the base 1, and a distance from a side surface of the photosensitive layer 302 facing away from the base 1 to the base 1 is smaller than a distance from a side surface of the planarization layer 8 facing away from the base 1 to the base 1.

As an example, referring to FIG. 5, the photoelectric sensor 3 has a stacked structure on a side of the interlayer dielectric layer 7 facing away from the base 1. In some implementations, the photoelectric sensor 3 includes a PIN photodiode or a PN photodiode, and an operating state of the photoelectric sensor 3 may be controlled by controlling voltages applied to the third electrode 301 and the fourth electrode 303. Taking the photoelectric sensor 3 including a PIN photodiode as an example, the photosensitive layer 302 includes an N type semiconductor layer (e.g., a P type a-Si layer), an intrinsic semiconductor layer (e.g., a-Si layer), and a P type semiconductor layer (e.g., an N type a-Si layer) arranged in stack.

The driver circuit layer further includes a passivation layer 22 between the interlayer dielectric layer 7 and the source-drain metal layer. The N type semiconductor layer is located between the interlayer dielectric layer 7 and the passivation layer 22. The source-drain metal layer includes a pattern of a source 16a of the first transistor 18a, a pattern of a drain 17a of the first transistor 18a, a bias signal supply line 20, a pattern of a source 16b of the second transistor 18b, a pattern of a drain 17b of the second transistor 18b, and a third electrode 301 of the photoelectric sensor 3. The third electrode 301 of the photoelectric sensor 3 is directly connected to the drain 17b of the second transistor 18b corresponding to the photoelectric sensor 3, and is connected to the N type semiconductor layer through a via hole in the passivation layer 22. The fourth electrode 303 is electrically connected to the bias signal supply line 20 through a conductive connection line 21 (disposed in the same layer as the first electrode 201 of the light-emitting element 2).

Figure 6:
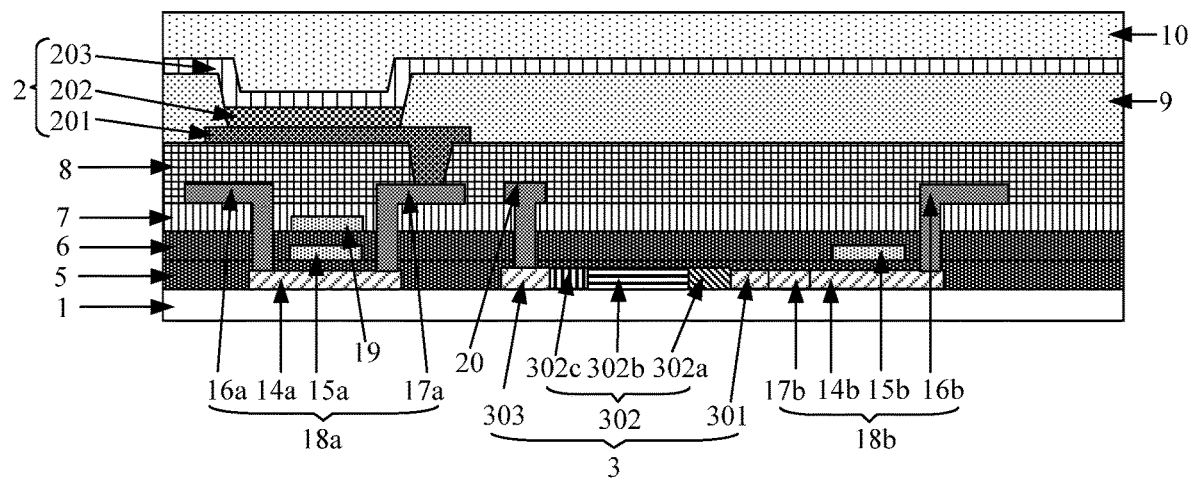
FIG. 6 is another schematic structural diagram of a light-emitting element and a photoelectric sensor in an embodiment of the present disclosure.

FIG. 6 is another schematic structural diagram of a light-emitting element and a photoelectric sensor in an embodiment of the present disclosure. As shown in FIG. 6, unlike the case shown in FIG. 5, in the case of FIG. 6, the light-emitting element 2 and the photoelectric sensor 3 are located on a same side of the base 1, and a plane where a side surface of the photosensitive layer 302 facing away from the base 1 is located between the drain 17a of the first transistor 18a and the base 1.

As an example, referring to FIG. 6, the photoelectric sensor 3 has a horizontal structure. That is, the third electrode 301, the photosensitive layer 302, and the fourth electrode 303 are disposed in parallel with the plane where the base 1 is located. The active layer includes an active pattern 14a of the first transistor 18a, an active pattern 14b of the second transistor 18b, a pattern of the third electrode 301 of the photoelectric sensor 3 (an active material is subjected to a conducting process), a pattern of the fourth electrode 303 of the photoelectric sensor 3 (the active material is subjected to a conducting process), and a pattern of a drain 17b of the second transistor 18b (the active material is subjected to a conducting process). The source-drain metal layer includes a pattern of a source 16a of the first transistor 18a, a pattern of a drain 17a of the first transistor 18a, a pattern of a source 16b of the second transistor 18b, and a bias signal supply line 20. The bias signal supply line 20 is connected to the fourth electrode 303 of the photoelectric sensor 3 through via holes in the interlayer dielectric layer 7, the second gate insulation layer 6, and the first gate line insulation layer.

Figure 7:
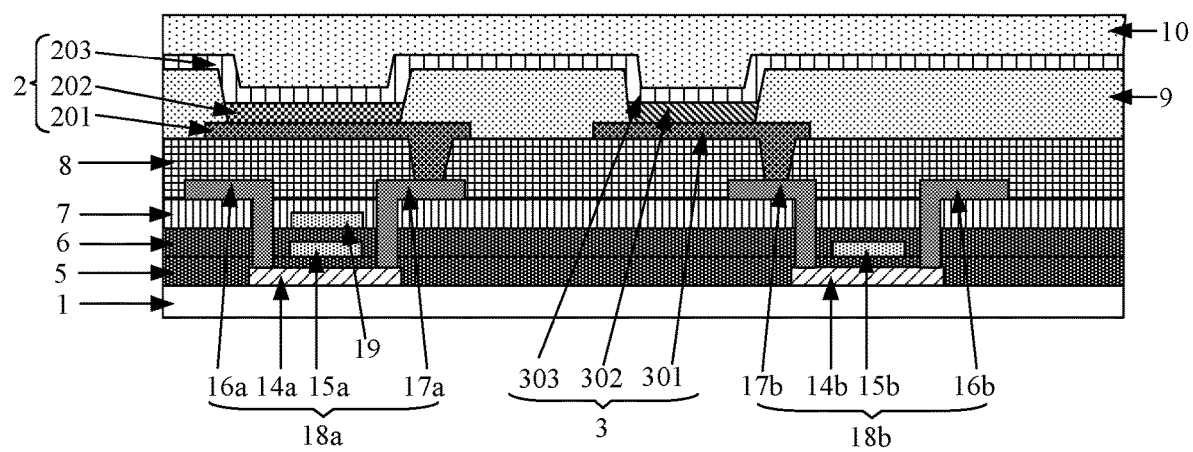
FIG. 7 is yet another schematic structural diagram of a light-emitting element and a photoelectric sensor in an embodiment of the present disclosure.

FIG. 7 is yet another schematic structural diagram of a light-emitting element and a photoelectric sensor in an embodiment of the present disclosure. As shown in FIG. 7, unlike the cases shown in FIGS. 5 and 6, in the case of FIG. 6, the light-emitting element 2 and the photoelectric sensor 3 are located on a same side of the base 1, and the photoelectric sensor 3 is located on a side of the planarization layer 8 facing away from the base 1.

As an example, referring to FIG. 7, the photoelectric sensor 3 has a stacked structure. In some implementations, a sensor receiving opening is provided in the pixel defining layer 9, the photoelectric sensor 3 is located in the sensor receiving opening. The third electrode 301 of the photoelectric sensor 3 is disposed in the same layer as the first electrode 201 of the light-emitting element 2. The fourth electrode 303 of the photoelectric sensor 3 is disposed in the same layer as the second electrodes 203 of the light-emitting element 2 (the fourth electrode 303 and the second electrode 203 may be the same electrode). The photosensitive layer 302 in the photoelectric sensor 3 may be prepared in the pixel opening through an evaporation process. The photosensitive layer 302 and the light-emitting layer 202 are disposed in a same layer, but made of different materials. The third electrode 301 of the photoelectric sensor 3 is connected to the drain 17b of the second transistor 18b, corresponding to the photoelectric sensor 3, through a via hole in the planarization layer 8.

In addition, in practical applications, an organic functional film layer, such as a hole transport layer, a hole injection layer, may be provided between the first electrode 201 and the light-emitting layer 202 (between the third electrode 301 and the photosensitive layer 302), and an organic functional film layer, such as an electron transport layer, an electron injection layer, may be provided between the second electrode 203 and the light-emitting layer 202 (between the fourth electrode 303 and the photosensitive layer 302).

It should be noted that since the photosensitive layer 302 and the light-emitting layer 202 are disposed in the same layer, and light emitted from the light-emitting layer 202 directly irradiates the photosensitive layer 302, the pixel defining layer 9 may be made of a light-blocking material (not shown in drawings), or a light-blocking pattern (as shown in FIG. 7) may be disposed between the light-emitting layer 202 and a light-reflecting layer.

Figure 8:
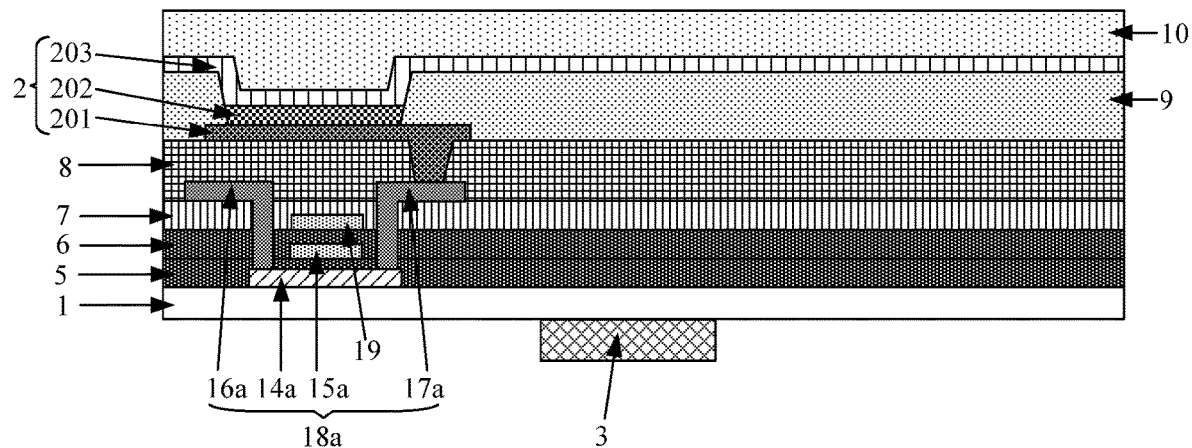
FIG. 8 is a still another schematic structural diagram of a light-emitting element and a photoelectric sensor in an embodiment of the present disclosure.

FIG. 8 is a still another schematic structural diagram of a light-emitting element and a photoelectric sensor in an embodiment of the present disclosure. As shown in FIG. 8, unlike the cases shown in FIGS. 5 to 7, in the case of FIG. 8, the light-emitting element 2 and the photoelectric sensor 3 are located on opposite sides of the base 1. The photoelectric sensor 3 may be integrated on a side of the base 1 facing away from the light-emitting element 2 in an on-cell mode or a plug-in mode.

The position and the structure of the photoelectric sensor 3 in the display panel shown in FIGS. 5 to 8 are merely exemplary, and neither the position nor the structure (e.g., a stacked structure or a horizontal structure) of the photoelectric sensor 3 in the display panel are limited in the technical solution of the present disclosure.

The following describes a collimation light path structure 4 in the embodiments of the present disclosure in detail with reference to the accompanying drawings.

Figure 9A:
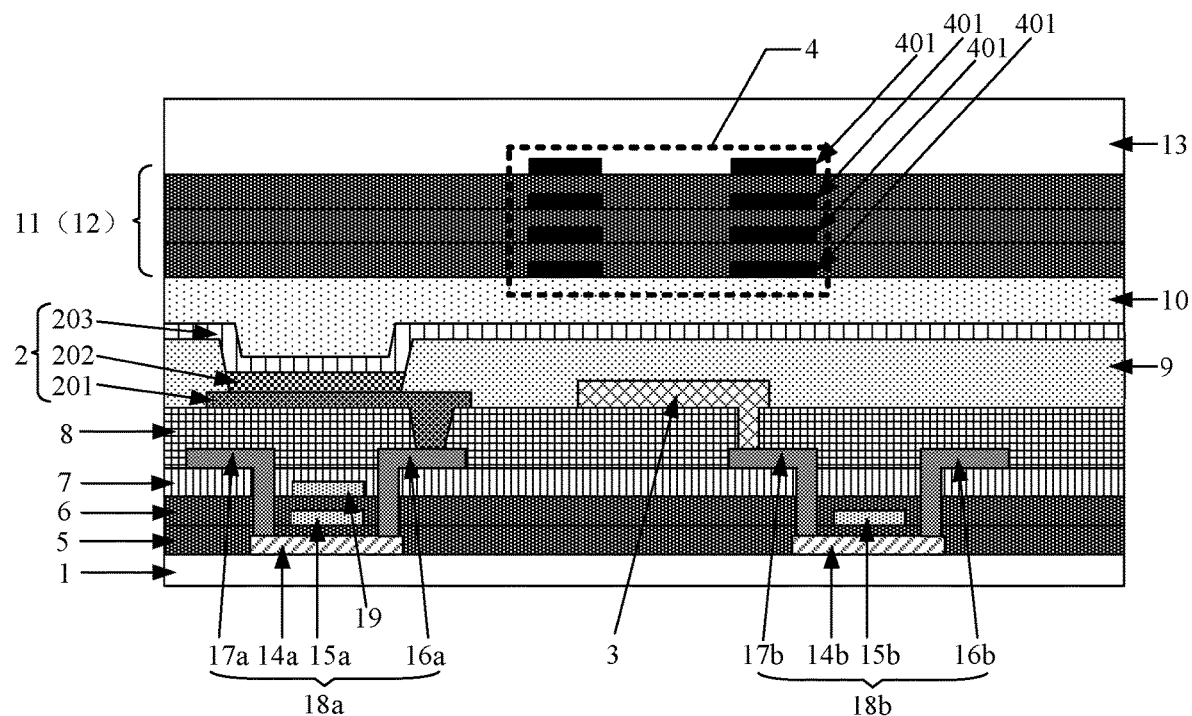
FIG. 9*a* to 9*c* are different schematic structural diagrams of a display panel with a photoelectric sensor being located between a planarization layer and a package layer in an embodiment of the present disclosure.
Figure 9B:
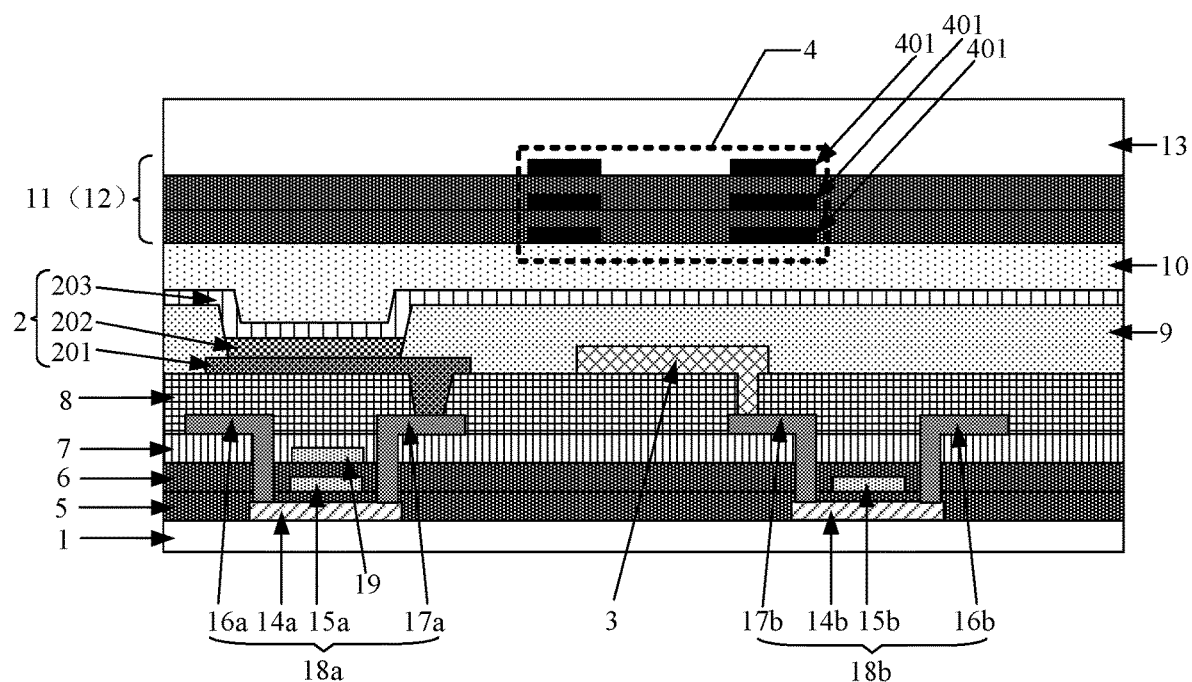
Figure 9C:
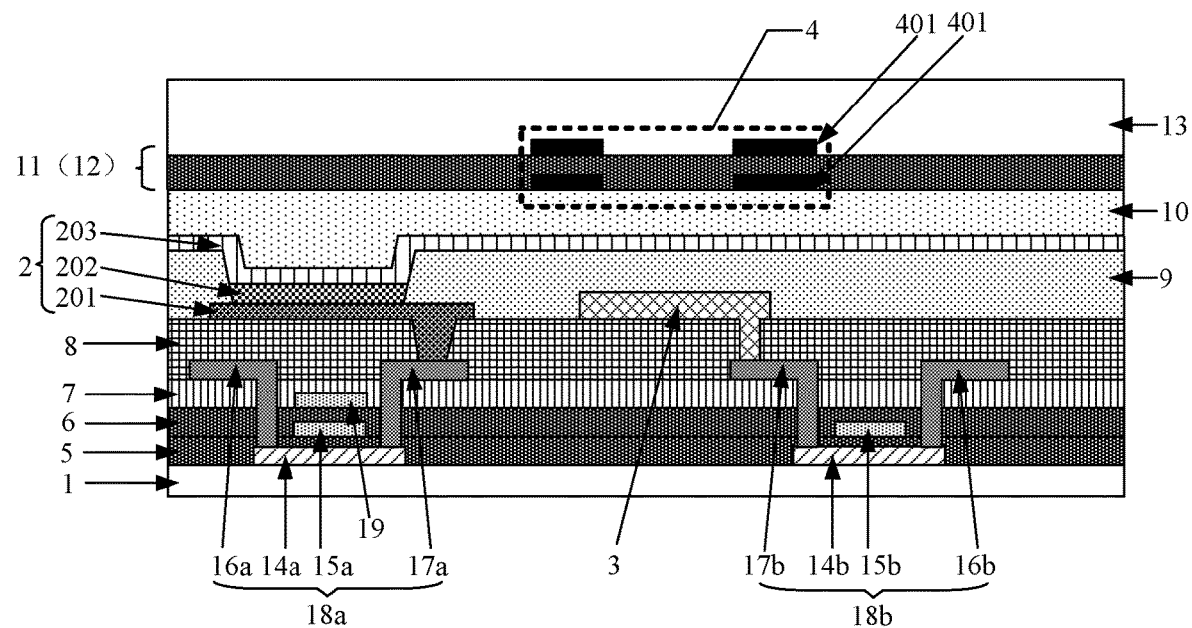

FIGS. 9a to 9c are different schematic structural diagrams of a display panel with a photoelectric sensor being located between a planarization layer and a package layer in an embodiment of the present disclosure. As shown in FIGS. 9a and 9c, in some implementations, the light-emitting element 2 and the photoelectric sensor 3 are located on a same side of the base 1, and the photoelectric sensor 3 is located between the planarization layer 8 and the package layer 10 (e.g., as shown in FIG. 7). In this case, the light-blocking layers in the collimation light path structure 4 include at least two first light-blocking layers 401. In the case shown in FIG. 9a, the black matrix 1201 in the display panel includes two layers stacked in the normal direction of the base 1. On a side of the package layer 10 facing away from the base 1, the first metal layer structure 1101, the second metal layer structure 1102, the touch insulation layer 1103 and the black matrix 1201 including the two layers are provided. The light-blocking layers include four first light-blocking layers 401. In the case shown in FIG. 9b, the light-blocking layers include three first light-blocking layers 401. In the case shown in FIG. 9a, the light-blocking layers include two first light-blocking layers 401. In FIGS. 9a to 9c, each first light-blocking layers 401 is disposed in the same layer as the first metal layer structure 1101, the second metal layer structure 1102, the touch insulation layer 1103 or the black matrix 1201 shown in FIG. 4a. When the touch insulation layer 1103 is made of a material having a light-blocking effect, in order to ensure normal light emission of the light-emitting element 2, the touch insulation layer 1103 does not cover a region where the light-emitting element 2 is located.

Certainly, in the present disclosure, the light-blocking layers in the collimation light path structure 4 may include five first light-blocking layers (which are respectively disposed in the same layer as the first metal layer structure 1101, the second metal layer structure 1102, the touch insulation layer 1103, and the two layers of the black matrix) or more first light-blocking layers (for example, when the black matrix includes more than two layers, the first light-blocking layers are respectively disposed in the same layer as the layers of the black matrix). These cases all fall in the scope of the present disclosure.

FIG. 10a to 10g are different schematic structural diagrams of a display panel with a photoelectric sensor 3 being located between a planarization layer 8 and an interlayer dielectric layer 7 in an embodiment of the present disclosure. As shown in FIG. 10a to 10g, in some implementations, the light-emitting element 2 and the photoelectric sensor 3 are located on a same side of the base 1, and the photoelectric sensor 3 is located on a side of the interlayer dielectric layer 7 facing away from the base 1. Meanwhile, a distance from a side surface of the photosensitive layer 302 facing away from the base 1 to the base 1 is smaller than a distance from a side surface of the planarization layer 8 facing away from the base 1 to the base 1 (as shown in the case of FIG. 5). In such case, the light-blocking layers in the collimation light path structure 4 may include merely the at least two first light-blocking layers 401 as described in the foregoing embodiments, or both the at least one first light-blocking layer 401, and the at least one second light-blocking layer 402 on a side of the package layer 10 close to the base 1 in the embodiments.

In some implementations, the pixel defining layer 9 and the planarization layer 8 may be made of a black resin material, and then, the pixel defining layer 9 and the planarization layer 8 may also serve as the second light-blocking layer 402. The first electrode 201 may be made of a metal material, and the second light-blocking layer 402 may be disposed in the same layer as the first electrode 201. In other words, based on the processes for preparing the pixel defining layer 9, the planarization layer 8, and the first electrode 201, corresponding second light-blocking layers 402 may be prepared simultaneously. The following describes in detail the case where the collimation light path structure 4 includes at least one first light-blocking layer 401 and at least one second light-blocking layer 402.

Figure 10A:
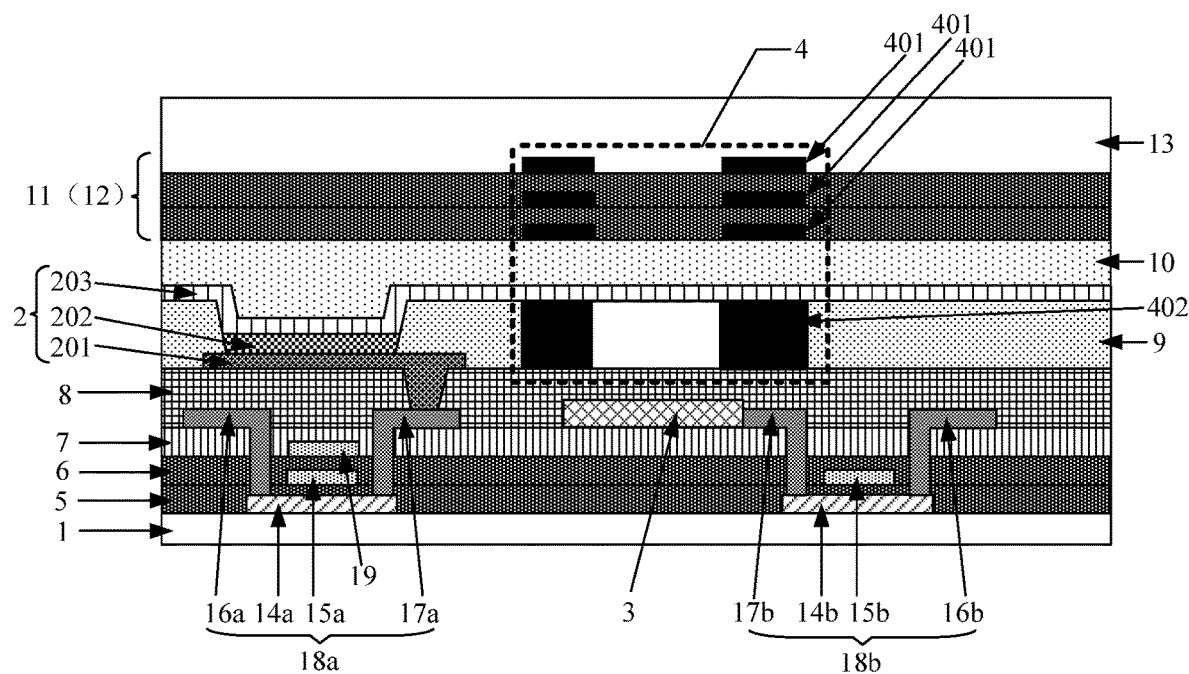
FIG. 10*a* to 10*g* are different schematic structural diagrams of a display panel with a photoelectric sensor being located between a planarization layer and an interlayer dielectric layer in an embodiment of the present disclosure.
Figure 10B:
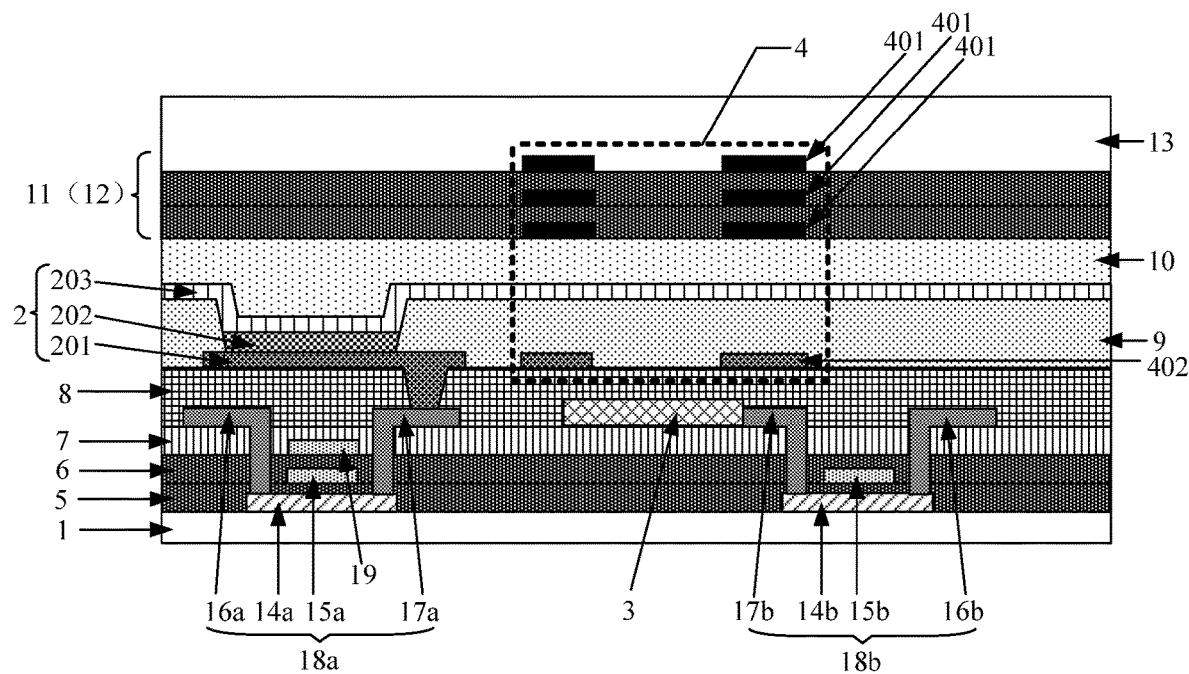
Figure 10C:
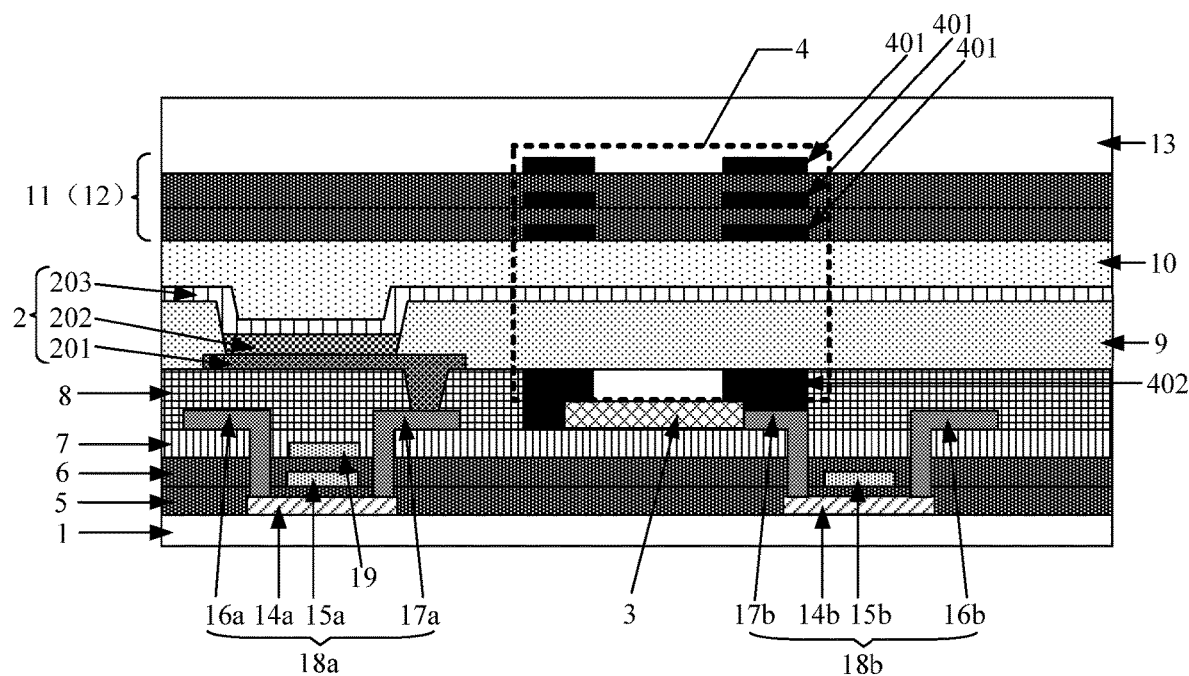

In the case shown in FIG. 10a to 10c, the collimation light path structure 4 includes three first light-blocking layers 401 and one second light-blocking layer 402. Specifically, the pixel defining layer 9 in FIG. 10a is made of a black resin material, and the pixel defining layer 9 is provided therein with a light-transmitting hole so as to also serve as the second light-blocking layer 402. The first electrode 201 in FIG. 10b is made of a metal material, and the second light-blocking layer 402 is disposed in the same layer as the first electrode 201. The planarization layer 8 in FIG. 10c is made of a black resin material, and the planarization layer 8 is provided therein with a light-transmitting hole so as to also serve as the second light-blocking layer 402.

It should be noted that in the case shown in FIG. 10a to 10c, the collimation light path structure 4 may include one, two, four or more first light-blocking layers 401.

Figure 10D:
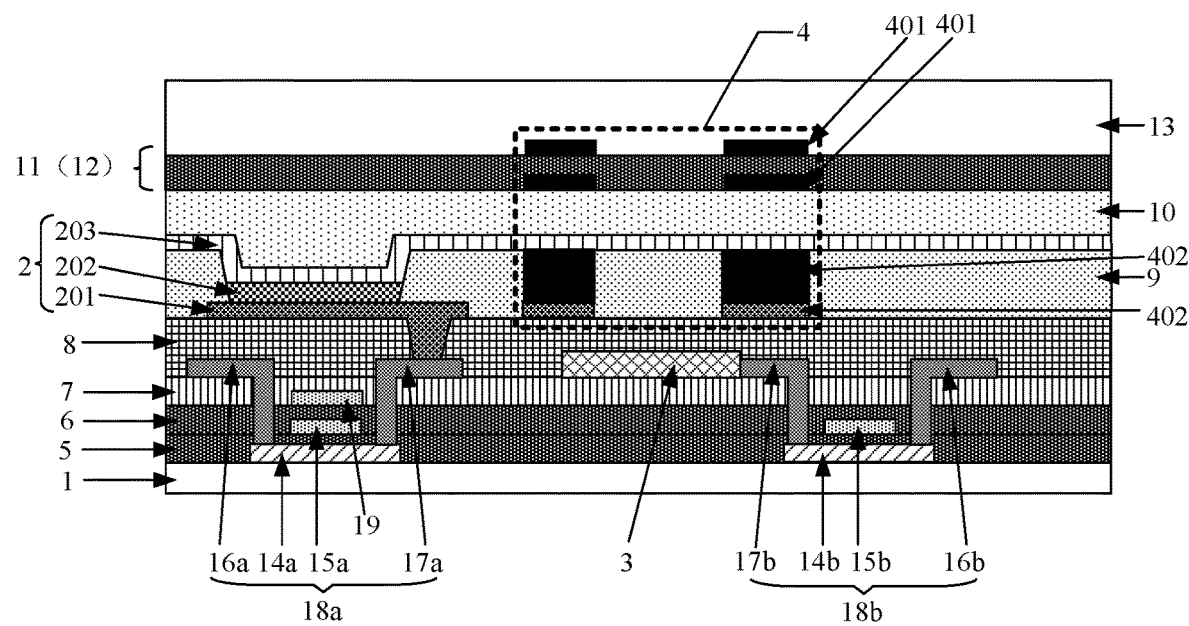
Figure 10E:
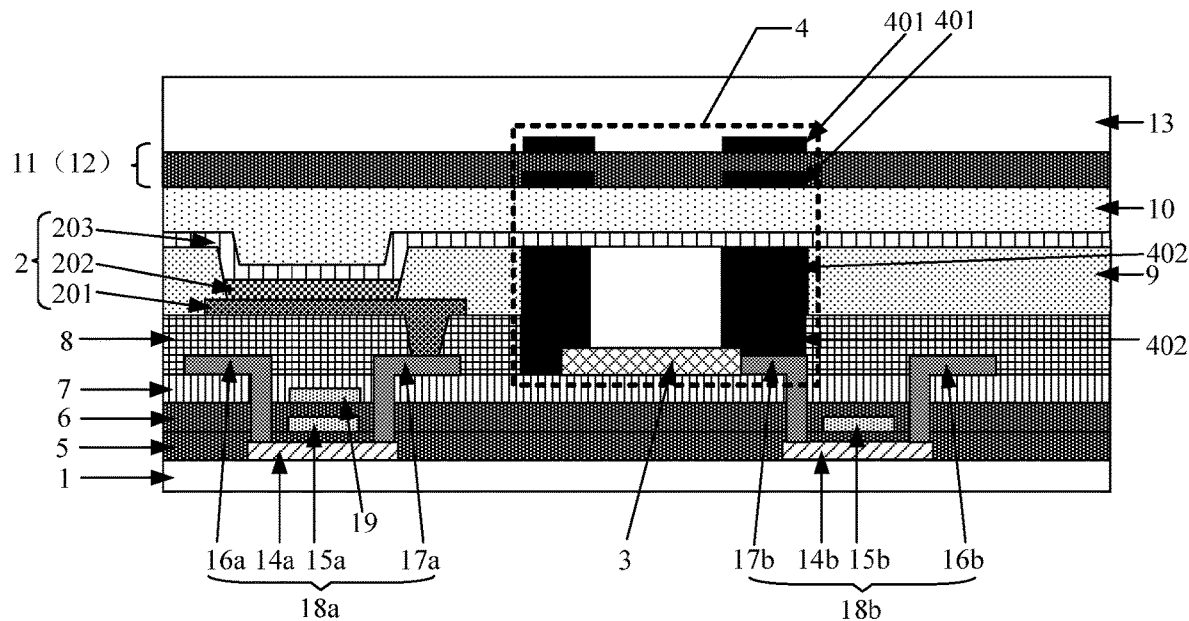
Figure 10F:
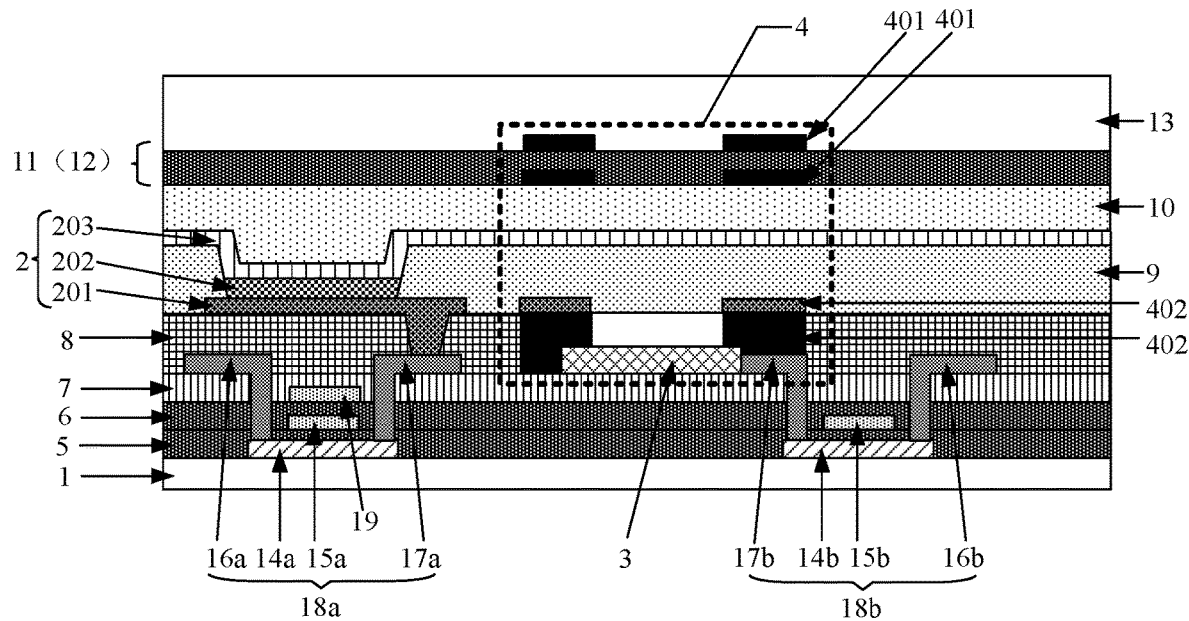

FIG. 10d to 10f show a case where the collimation light path structure 4 includes two first light-blocking layers 401 and two second light-blocking layers 402. Specifically, the pixel defining layer 9 in FIG. 10d is made of a black resin material, and the pixel defining layer 9 is provided therein with a light-transmitting hole so as to also serve as one second light-blocking layer 402. Meanwhile, the first electrode 201 is made of a metal material, and another second light-blocking layer 402 is disposed in the same layer as the first electrode 201. The pixel defining layer 9 and the planarization layer 8 in FIG. 10e are both made of a black resin material, the pixel defining layer 9 is provided therein with a light-transmitting hole so as to also serve as one second light-blocking layer 402, and the planarization layer 8 is provided therein with a light-transmitting hole so as to also serve as another second light-blocking layer 402. The first electrode 201 in FIG. 10f is made of a metal material, one second light-blocking layer 402 is disposed in the same layer as the first electrode 201, the planarization layer 8 is made of a black resin material, and the planarization layer 8 is provided therein with a light-transmitting hole so as to also serve as another second light-blocking layer 402.

It should be noted that, in the case shown in FIG. 10d to 10f, the collimation light path structure 4 may include one, three or four first light-blocking layers 401.

Figure 10G:
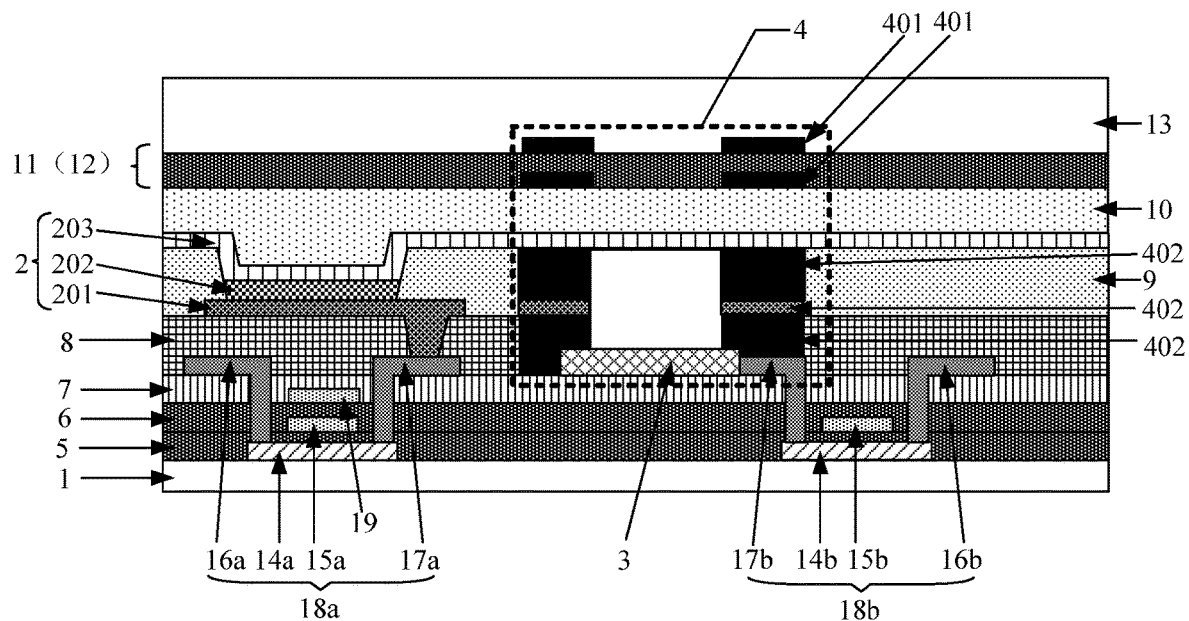

FIG. 10g shows a case where the collimation light path structure 4 includes one first light-blocking layer 401 and three second light-blocking layers 402. Specifically, the pixel defining layer 9 and the planarization layer 8 in FIG. 10d are both made of a black resin material, the first electrode 201 is made of a metal material, the pixel defining layer 9 is provided therein with a light-transmitting hole so as to also serve as one second light-blocking layer 402, the planarization layer 8 is provided therein with a light-transmitting hole so as to also serve as another second light-blocking layer 402, and further another (i.e., a third) second light-blocking layer 402 is disposed in the same layer as the first electrode 201.

It should be noted that, in the case shown in FIG. 10d to 10f, the collimation light path structure 4 may include two, three, four or more first light-blocking layers 401.

Each first light-blocking layer 401 in FIG. 10a to 10g is disposed in the same layer as the first metal layer structure 1101, the second metal layer structure 1102, or the black matrix 1201 shown in FIG. 4a.

Figure 11A:
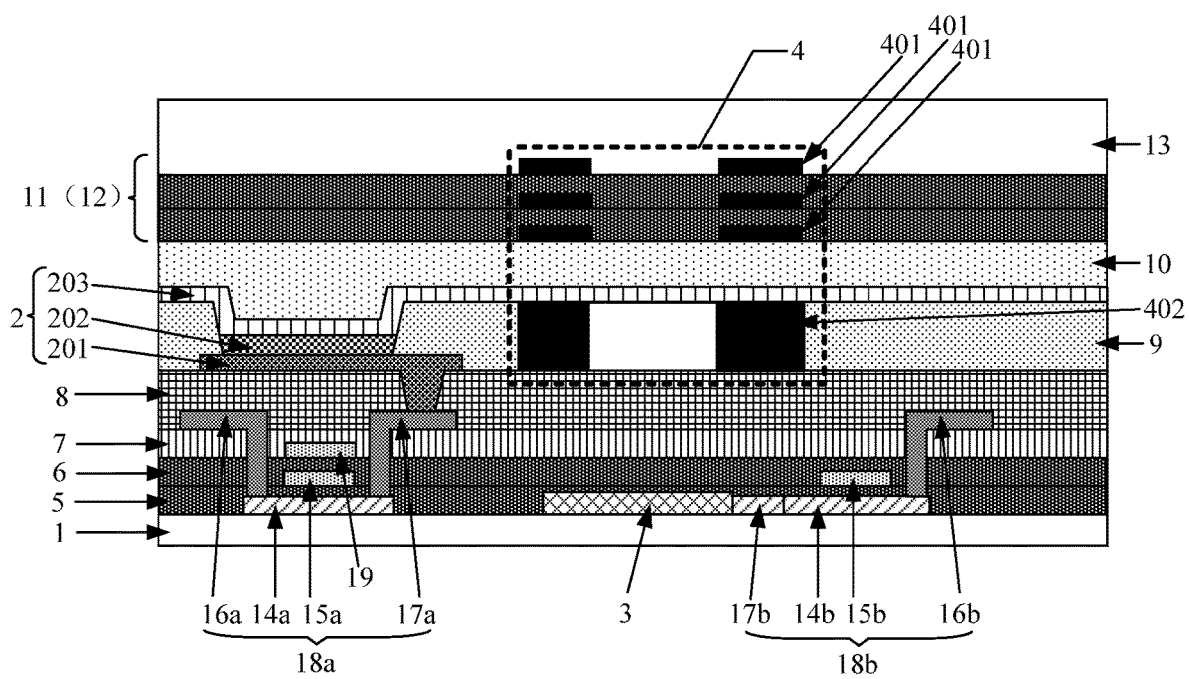
FIG. 11*a* to 11*o* are different schematic structural diagrams of a display panel with a plane where a side surface of a photosensitive layer facing away from a base being located between a drain of a first transistor and the base in an embodiment of the present disclosure.
Figure 11B:
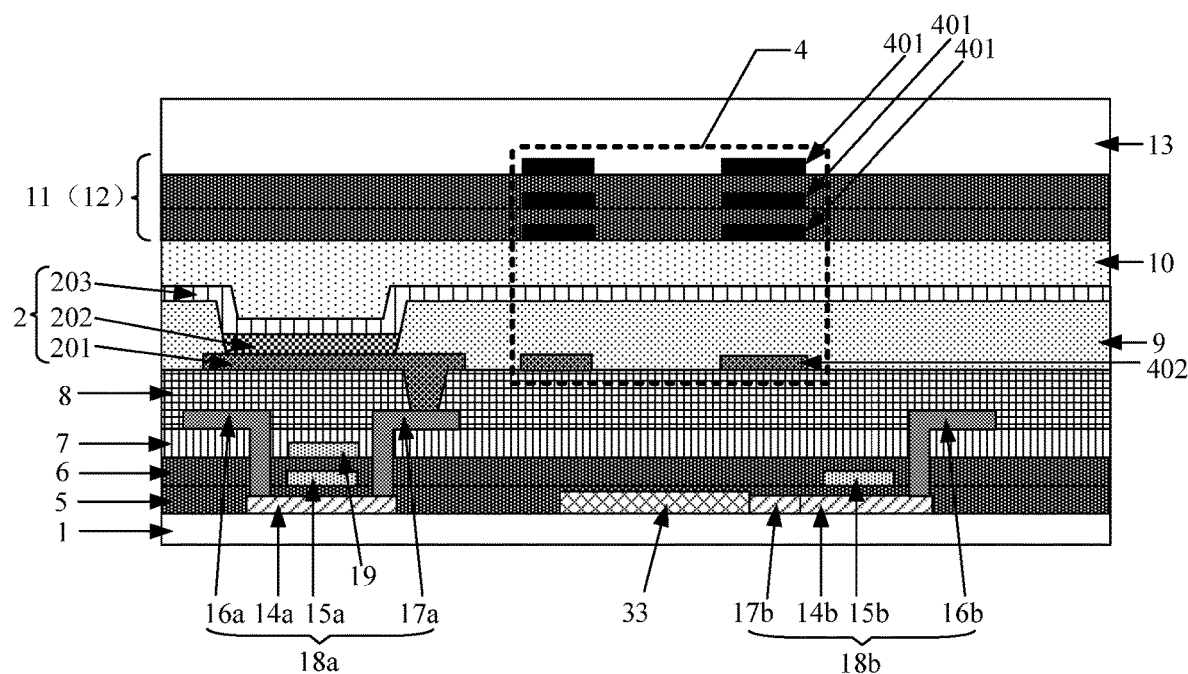
Figure 11C:
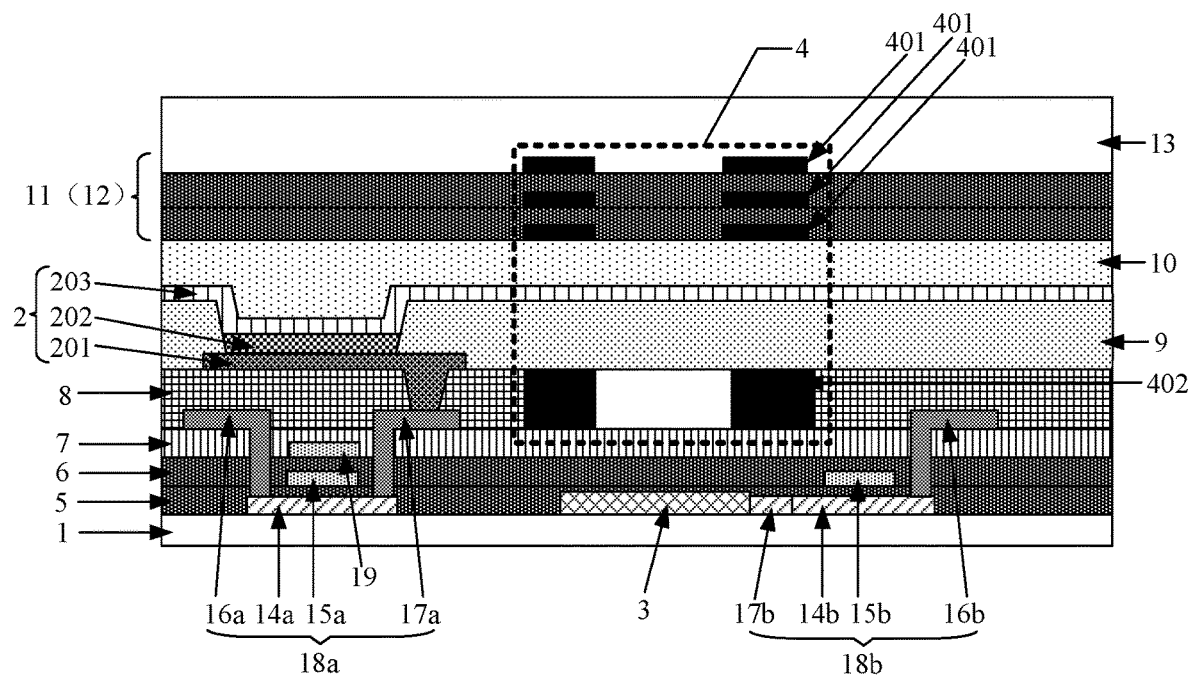
Figure 11D:
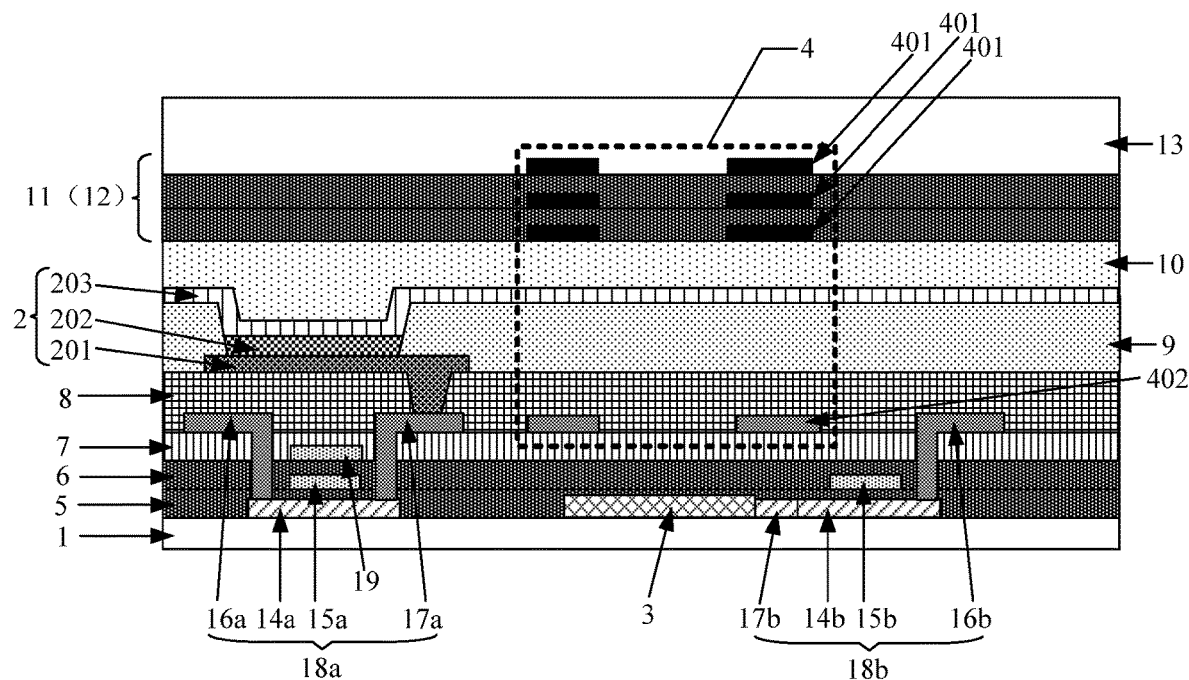
Figure 11E:
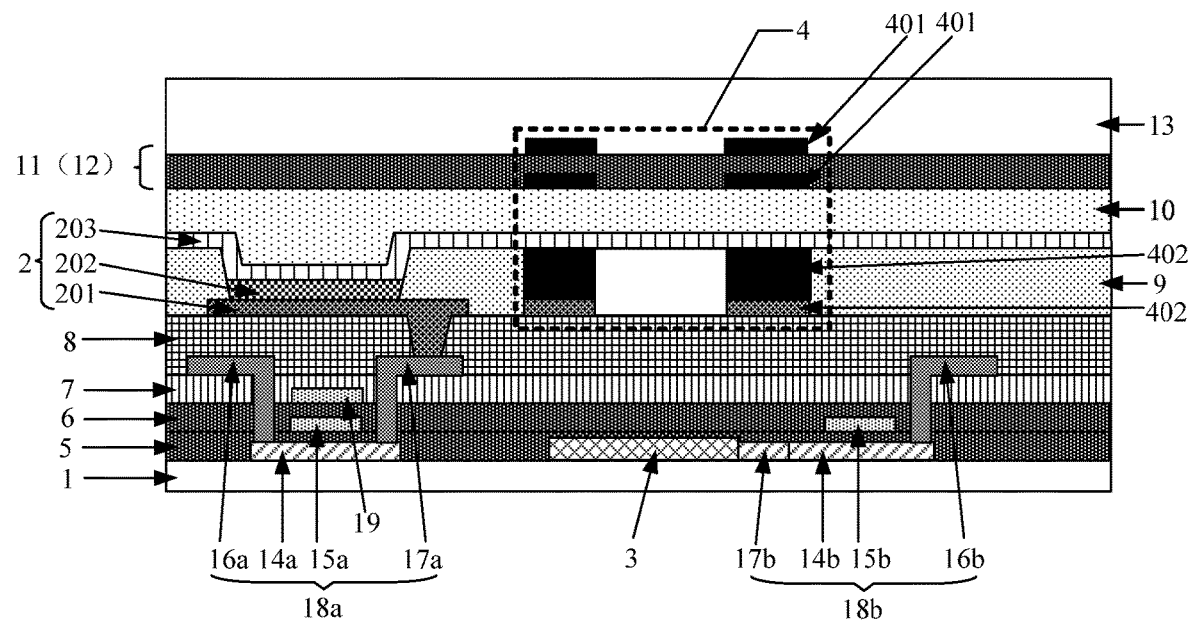
Figure 11F:
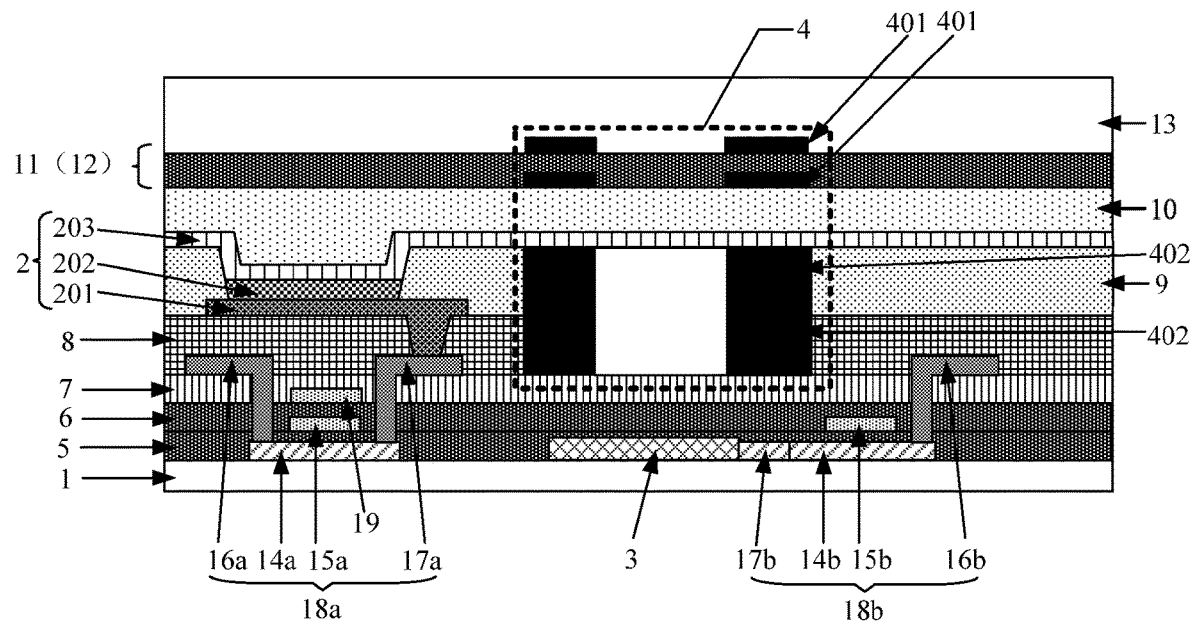
Figure 11G:
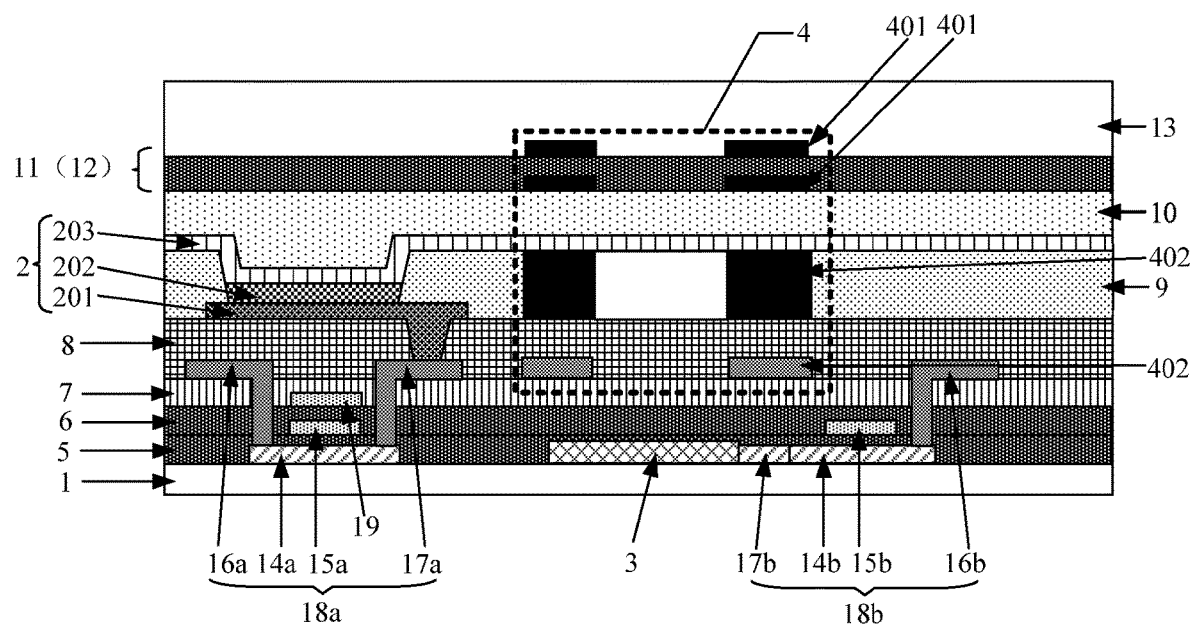
Figure 11H:
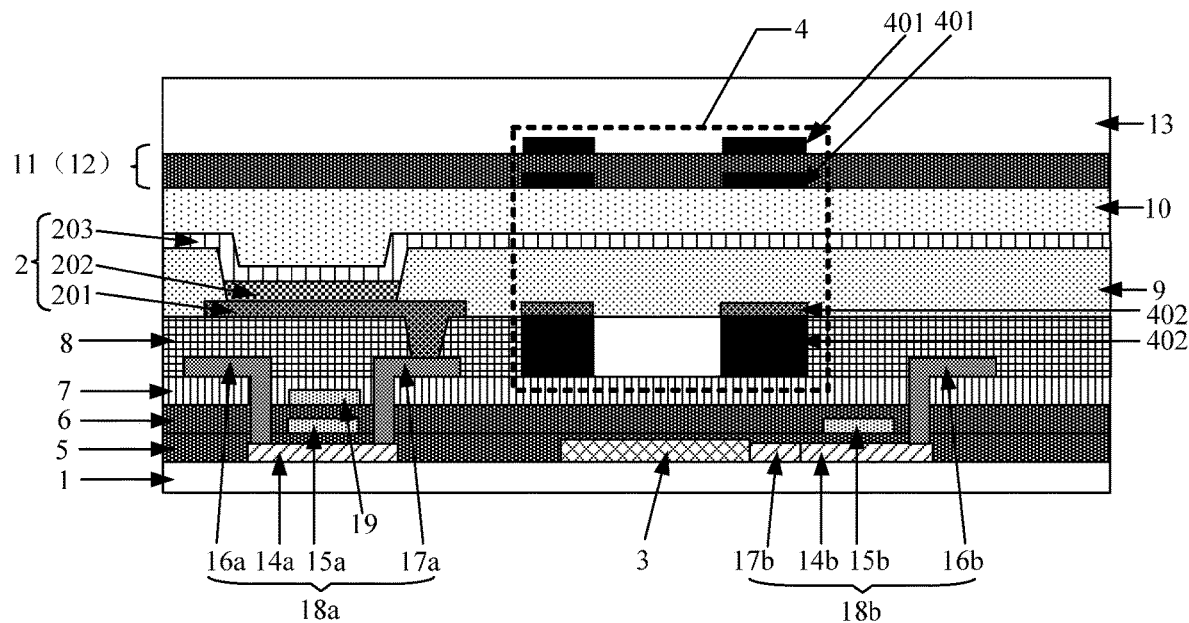
Figure 11I:
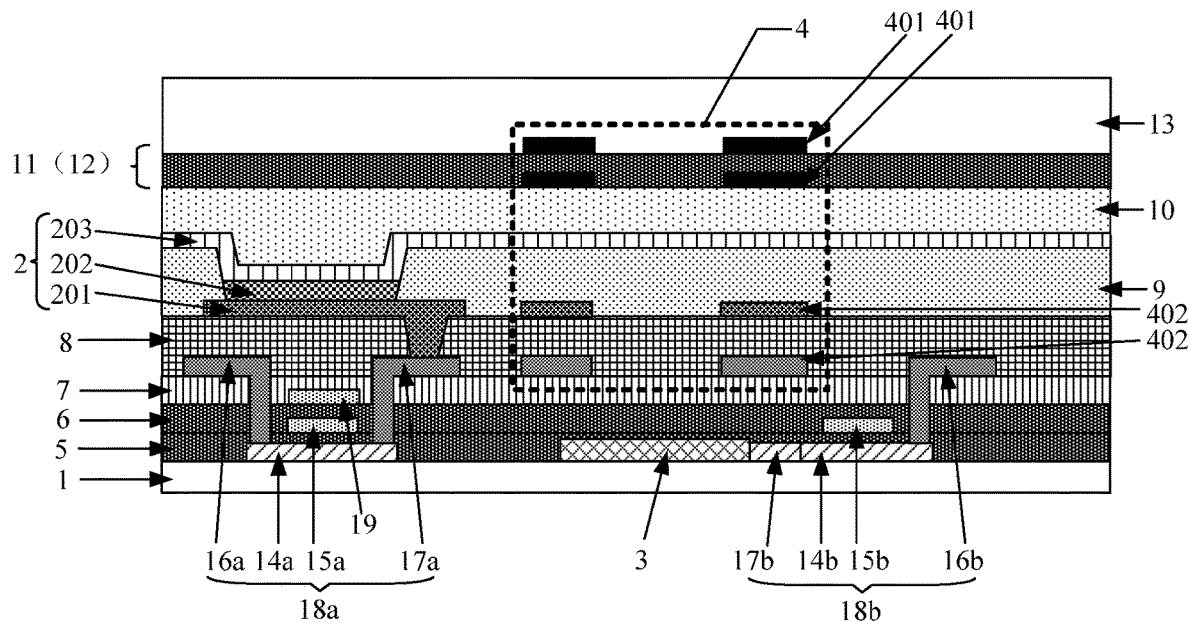
Figure 11J:
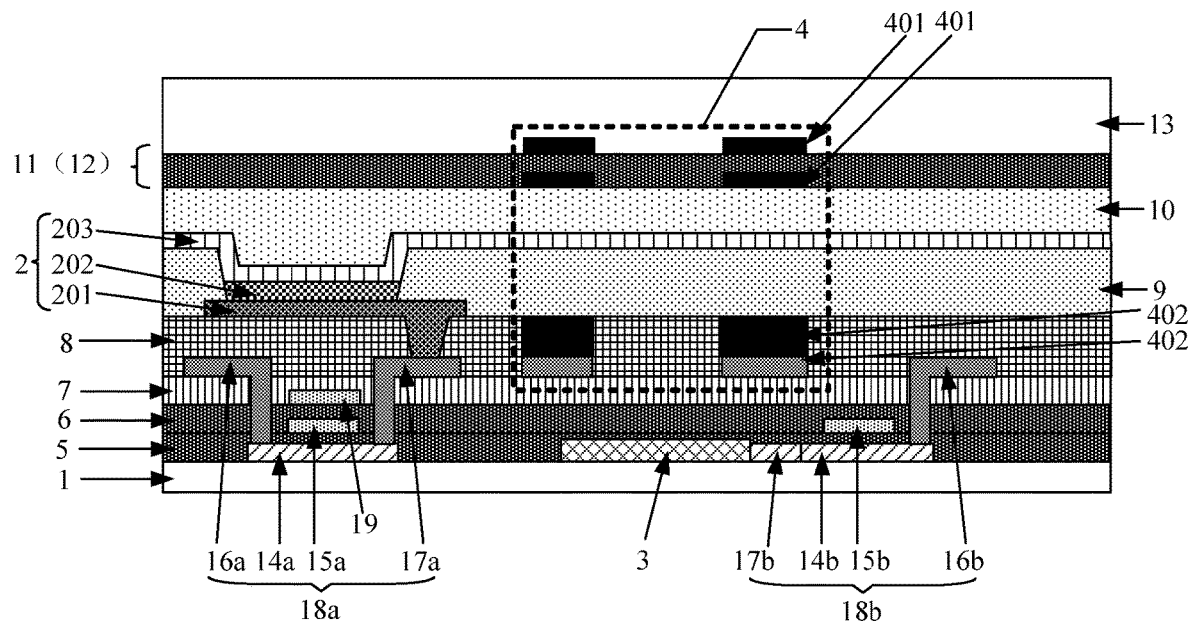
Figure 11K:
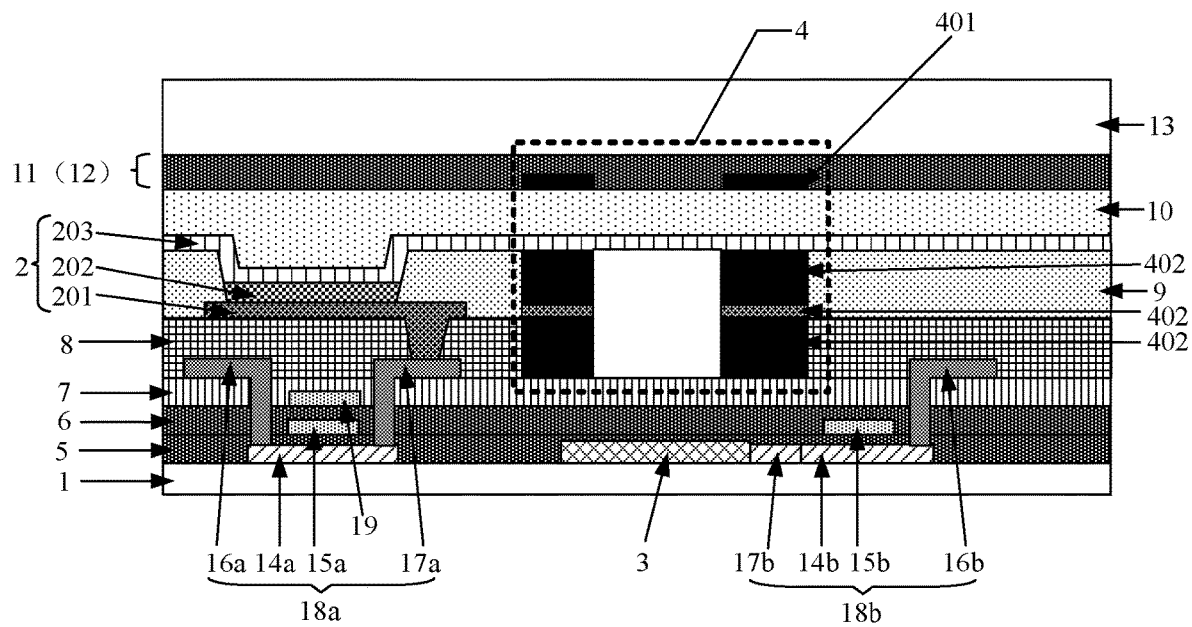
Figure 11L:
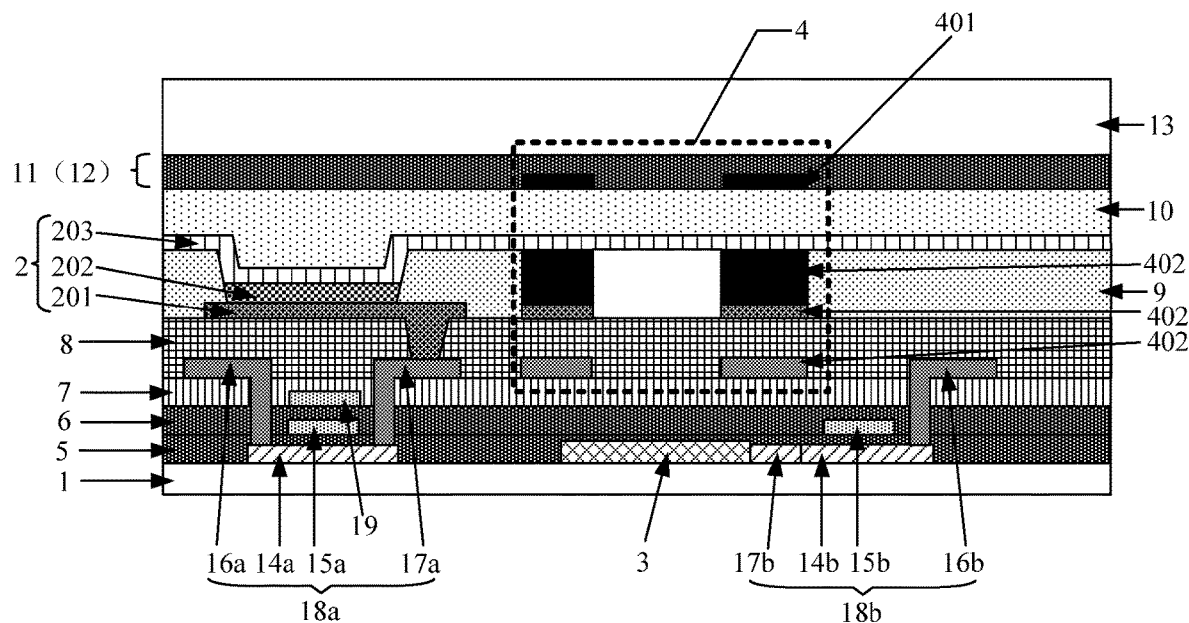
Figure 11M:
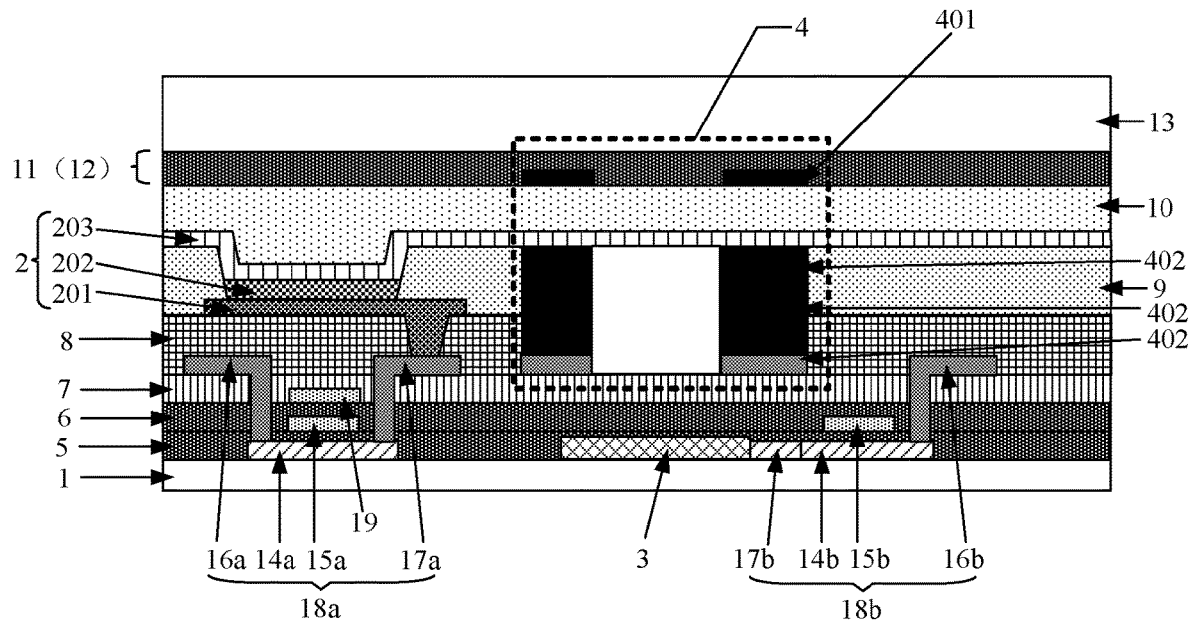
Figure 11N:
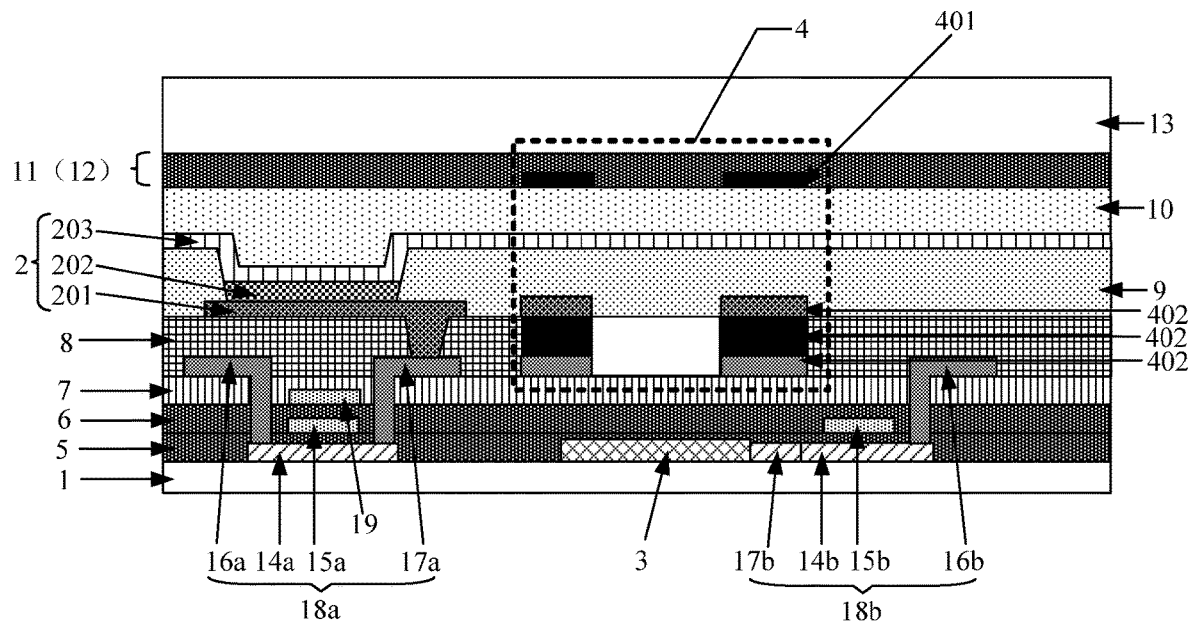
Figure 11O:
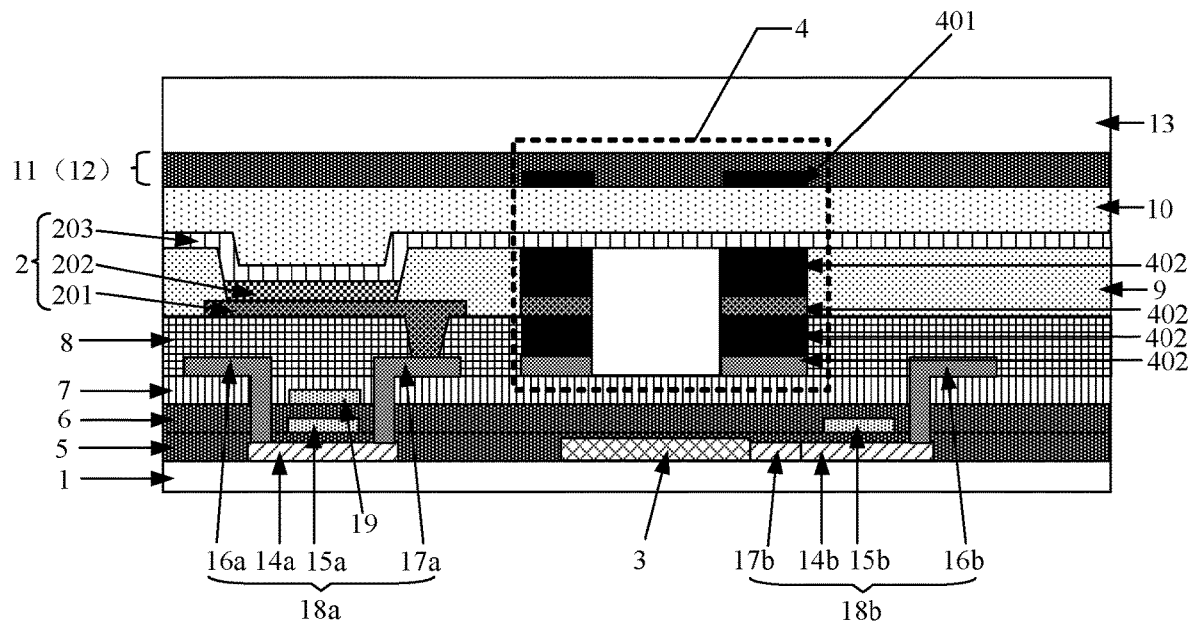

FIG. 11a to 11o are different schematic structural diagrams of a display panel with a plane, where a side surface of a photosensitive layer facing away from the base is located, is located between a drain of a first transistor and the base in an embodiment of the present disclosure. As shown in FIG. 11a to 11o, in some implementations, a plane, where a side surface of the photosensitive layer 302 facing away from the base 1 is located, is located between the drain 17a of the first transistor 18a and the base 1 (e.g., as the case shown in FIG. 6).

In such case, the light-blocking layers in the collimation light path structure 4 may include merely the at least two first light-blocking layers 401 as described in the foregoing embodiments, or both the at least one first light-blocking layer 401 and the at least one second light-blocking layer 402 on a side of the package layer 10 close to the base 1 in the embodiments.

In some implementations, the pixel defining layer 9 and the planarization layer 8 may be made of a black resin material, and then, the pixel defining layer 9 and the planarization layer 8 may also serve as the second light-blocking layers 402. The first electrode 201 may be made of a metal material, and the second light-blocking layer 402 may be disposed in the same layer as the first electrode 201. The drain 17a of the first transistor 18a is made of a metal material, and the second light-blocking layer 402 may be disposed in the same layer as the drain 17a of the first transistor 18a. In other words, based on the processes for preparing the pixel defining layer 9, the planarization layer 8, the first electrode 201, and the drain 17a of the first transistor 18a, corresponding second light-blocking layers 402 may be prepared simultaneously. The following describes in detail the case where the collimation light path structure 4 includes at least one first light-blocking layer 401 and at least one second light-blocking layer 402.

FIG. 11a to 11d show a case where the collimation light path structure 4 includes three first light-blocking layers 401 and one second light-blocking layer 402. Specifically, the pixel defining layer 9 in FIG. 11a is made of a black resin material, and the pixel defining layer 9 is provided therein with a light-transmitting hole so as to also serve as one second light-blocking layer 402. The first electrode 201 in FIG. 11b is made of a metal material, and one second light-blocking layer 402 is disposed in the same layer as the first electrode 201. The planarization layer 8 in FIG. 11c is made of a black resin material, and the planarization layer 8 is provided therein with a light-transmitting hole so as to also serve as one second light-blocking layer 402. The drain 17a of the first transistor 18a in FIG. 11d is made of a metal material, and one second light-blocking layer 402 is disposed in the same layer as the drain 17a of the first transistor 18a.

It should be noted that, in the case shown in FIG. 11a to 11d, the collimation light path structure 4 may include one, two, four or more first light-blocking layers 401.

FIG. 11e to 11j show a case where the collimation light path structure 4 includes two first light-blocking layers 401 and two second light-blocking layers 402. Specifically, the pixel defining layer 9 in FIG. 11e is made of a black resin material, and the pixel defining layer 9 is provided therein with a light-transmitting hole so as to also serve as one second light-blocking layer 402. Meanwhile, the first electrode 201 is made of a metal material, and another second light-blocking layer 402 is disposed in the same layer as the first electrode 201. The pixel defining layer 9 and the planarization layer 8 in FIG. 11f are both made of a black resin material, the pixel defining layer 9 is provided therein with a light-transmitting hole so as to also serve as one second light-blocking layer 402, and the planarization layer 8 is provided therein with a light-transmitting hole so as to also serve as another second light-blocking layer 402. The pixel defining layer 9 in FIG. 11g is made of a black resin material, and the pixel defining layer 9 is provided therein with a light-transmitting hole so as to also serve as one second light-blocking layer 402. Meanwhile, the drain 17a of the first transistor 18a is made of a metal material, and another second light-blocking layer 402 is disposed in the same layer as the drain 17a of the first transistor 18a. The first electrode 201 in FIG. 11h is made of a metal material, and one second light-blocking layer 402 is disposed in the same layer as the first electrode 201. Meanwhile, the planarization layer 8 is made of a black resin material, and the pixel defining layer 9 is provided therein with a light-transmitting hole so as to also serve as another second light-blocking layer 402. The first electrode 201 in FIG. 11i is made of a metal material, and one second light-blocking layer 402 is disposed in the same layer as the first electrode 201. Meanwhile, the drain 17a of the first transistor 18a is made of a metal material, and another second light-blocking layer 402 is disposed in the same layer as the drain 17a of the first transistor 18a. The planarization layer 8 in FIG. 11j is made of a black resin material, and the planarization layer 8 is provided therein with a light-transmitting hole so as to also serve as one second light-blocking layer 402. Meanwhile, the drain 17a of the first transistor 18a is made of a metal material, and another second light-blocking layer 402 is disposed in the same layer as the drain 17a of the first transistor 18a.

It should be noted that, in the case shown in FIG. 11e to 11j, the collimation light path structure 4 may include one, three, four or more first light-blocking layers 401.

FIG. 11k to 11n show a case where the collimation light path structure 4 includes one first light-blocking layer 401 and three second light-blocking layers 402. Specifically, the pixel defining layer 9 and the planarization layer 8 in FIG. 11k are both made of a black resin material, the pixel defining layer 9 is provided therein with a light-transmitting hole so as to also serve as one second light-blocking layer 402, and a light-transmitting hole is formed in the planarization layer 8 so that the planarization layer 8 also serves as another second light-blocking layer 402. Meanwhile, the first electrode 201 is made of a metal material, and a third second light-blocking layer 402 is disposed in the same layer as the first electrode 201. The pixel defining layer 9 in FIG. 11l is made of a black resin material, and the pixel defining layer 9 is provided therein with a light-transmitting hole so as to also serve as one second light-blocking layer 402. Meanwhile, the first electrode 201 and the drain 17a of the first transistor 18a are made of a metal material, another second light-blocking layer 402 is disposed in the same layer as the first electrode 201, and the third second light-blocking layer 402 is disposed in the same layer as the drain 17a of the first transistor 18a. The pixel defining layer 9 and the planarization layer 8 in FIG. 11m are both made of a black resin material, the pixel defining layer 9 is provided therein with a light-transmitting hole so as to also serve as one second light-blocking layer 402, and a light-transmitting hole is formed in the planarization layer 8 so that the planarization layer 8 also serves as another second light-blocking layer 402. Meanwhile, the drain 17a of the first transistor 18a is made of a metal material, and the third second light-blocking layer 402 is disposed in the same layer as the drain 17a of the first transistor 18a. The planarization layer 8 in FIG. 11n is made of a black resin material, and the planarization layer 8 is provided therein with a light-transmitting hole so as to also serve as one second light-blocking layer 402. Meanwhile, the first electrode 201 and the drain 17a of the first transistor 18a are made of a metal material, another second light-blocking layer 402 is disposed in the same layer as the first electrode 201, and the third second light-blocking layer 402 is disposed in the same layer as the drain 17a of the first transistor 18a.

FIG. 11o shows a case where the collimation light path structure 4 includes one first light-blocking layer 401 and four second light-blocking layers 402. Specifically, the pixel defining layer 9 and the planarization layer 8 in FIG. 11o are both made of a black resin material, the first electrode 201 and the drain 17a of the first transistor 18a are made of a metal material, the pixel defining layer 9 is provided therein with a light-transmitting hole so as to also serve as one second light-blocking layer 402, the planarization layer 8 is provided therein with a light-transmitting hole so as to also serve as another second light-blocking layer 402, a third second light-blocking layer 402 is disposed in the same layer as the first electrode 201, and a fourth second light-blocking layer 402 is disposed in the same layer as the drain 17a of the first transistor 18a.

It should be noted that, in the case shown in FIG. 11k to 11o, the collimation light path structure 4 may include two, three, four or more first light-blocking layers 401.

Each first light-blocking layer 401 in FIG. 11a to 11o is disposed in the same layer as the first metal layer structure 1101, the second metal layer structure 1102, or the black matrix 1201 shown in FIG. 4a.

In a case where the light-emitting element 2 and the photoelectric sensor 3 are located on opposite sides of the base 1, the structure of the collimation light path structure 4 may be similar to that in the case where a plane, where a side surface of the photosensitive layer 302 facing away from the base 1 is located, is located between the drain 17a of the first transistor 18a and the base 1. Details may be referred to the foregoing description of FIG. 11a to 11o, and thus are not repeated here.

In the above embodiments, when the planarization layer 8 or the pixel defining layer 9 also serves as the second light-blocking layer 402, the regions of light-transmitting holes in the planarization layer 8 and the pixel defining layer 9 may be filled with a transparent resin material, and merely the portions of the planarization layer 8 or the pixel defining layer 9 surrounding the light-transmitting hole are illustrated in black in the drawings.

Referring to the previous figures, in some implementations, the light-transmitting holes in the light-blocking layers of the collimation light path structure 4 have a same shape and a same aperture.

In some implementations, an orthographic projection of each light-transmitting hole in each light-blocking layer on the base is completely coincident with an orthographic projection of the light-transmitting hole, corresponding to said each light-transmitting hole, in another light-blocking layer on the base 1. In some implementations, the light-transmitting hole has an aperture D, and in the collimation light path structure 4, a distance from a side surface of the light-blocking layer, closest to the base 1, facing the base 1 to a side surface of the light-blocking layer, farthest from the base 1, facing away from the base is H. In such case, light is emitted from each collimation light-transmitting channel in the collimation light path structure 4 at an exiting angle (an angle formed by the light and the normal direction of the substrate) in a range of [0°, arctan(D/H)]. In practical applications, values of D and H may be reasonably designed according to actual expectations for filtering and actual performance of the production line, so as to control a value of arctan(D/H), and limit the range of the exiting angle of light emitted from the collimation light-transmitting channel. In some implementations, arctan(D/H) takes a value in a range of [10°, 20°].

It should be noted that, the case where the light-transmitting holes in the light-blocking layers of the collimation light path structure 4 have a same shape and a same aperture is merely an implementation for the present disclosure, and does not result in any limitation to the technical solution of the present disclosure. In the embodiments of the present disclosure, the light-transmitting holes in the light-blocking layers may have different shapes and different apertures, as long as the light-transmitting holes in different light-blocking layers are in correspondence one to one and have orthographic projections, which at least partially coincide with each other, on the base 1.

In an embodiment of the present disclosure, all light emitted from the collimation light-transmitting channel is within a certain angle range, and a difference between a maximum angle and a minimum angle in the angle range is a light-receiving angle of the light-transmitting channel. In some implementations, the collimation light-transmitting channel has a collimation light-receiving angle in a range of [10°, 20°].

In the embodiments of the present disclosure, the following scheme may be adopted for the material and thickness of each film layer in the display panel. For example, the buffer layer is made of a material including SiNx/SiOx, where a film of SiNx has a thickness of 1000 Å±7%, and a film of SiOx has a thickness of 3000 Å±7%; the active layer is made of a material including P—Si, and the active layer has a film thickness of 500 Å±5%; the first gate insulation layer 5 is made of a material including SiOx, and has a film thickness of 1200 Å±7%; the first gate metal layer is made of a material including Mo, and has a film thickness of 3000 Å±13%; the second gate insulation layer 6 is made of a material including SiNx, and has a film thickness of 1300 Å±7%; the second gate metal layer is made of a material including Mo, and has a film thickness of 3000 Å±13%; the interlayer dielectric layer 7 is made of a material including SiOx/SiNx, where a film of SiOx has a thickness of 2000 Å±7%, and a film of SiNx has a thickness of 3000 Å±7%; the source-drain metal layer is made of a material including Ti/Al/Ti, each film of Ti has a thickness of about 500 Å, a film of Al has a thickness of about 5500 Å, and the source-drain metal layer has an overall thickness of 6500 Å±15%; the planarization layer 8 is made of a material including polyimide (PI), and has a thickness of 15000 Å±2.5%; the film layer where the first electrode 201 is located is made of a material including ITO/Ag/ITO, where each layer of the ITO has a thickness of about 70 Å, a film of Ag has a thickness of about 1000 Å, and the film layer where first electrode 201 is located has an overall thickness of 1140 Å±15%; the pixel defining layer 9 is made of a material including polyimide (PI), and has a thickness of 15000 Å±2.5%; the support dam is made of a material including polyimide (PI), and has a thickness of 15000 Å±2.5%; the first metal layer structure 1101 is made of a material including Ti/Al/Ti, where a film of Ti on a side of the film of Al facing the base 1 has a thickness of about 300 Å, a film of Al has a thickness of about 1500 Å, a film of Ti on a side of the film of Al facing away from the base 1 has a thickness of about 500 Å, and the first metal layer structure 1101 has an overall thickness of 2300 Å±15%; the touch insulation layer 1103 is made of a material including an organic insulating material (e.g., optical-clear (OC) adhesive) or inorganic insulating material (e.g., SiNx), and has a thickness of 3500 Å±7%; the second metal layer structure 1102 is made of a material including Ti/Al/Ti, where each film of Ti has a thickness of about 300 Å, a film of Al has a thickness of about 3000 Å, and the second metal layer structure 1102 has an overall thickness of 3600 Å±15%; the black matrix 1201 is made of a material including a black resin material, and has a film thickness of 13000 Å±5%; the color filter film 1202 is made of a material including a color resin material, and has a film thickness of 30000 Å±5%.

In an embodiment of the present disclosure, the first light-blocking layer 401 and the second light-blocking layer 402 are both prepared based on the process for preparing the display panel in the existing art, and in practical applications, the number and positions of first light-blocking layers 401 and second light-blocking layers 402 may be designed according to the material and thickness of each film layer in the display panel in the existing art and based on actual expectations. In an embodiment of the present disclosure, it is sufficient as long as the collimation light path structure 4 includes at least one first light-blocking layer 401. It should be noted that, in a case where the collimation light path structure 4 does not include any second light-blocking layer 402, the collimation light path structure 4 includes at least two first light-blocking layers 401. In some implementations, the number of light-blocking layers in the collimation light path structure 4 is less than or equal to 4.

Based on the same inventive concept, an embodiment of the present disclosure further provides a display device, including the display panel according to any embodiment described above. For detailed description of the display panel, reference may be made to corresponding contents in the foregoing embodiments, which will not be repeated here.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should be considered as falling into the protection scope of the present disclosure.

What is claimed is:

1. A display panel, comprising:
   a base;
   a light-emitting structure on a side of the base;
   a package layer on a side of the light-emitting structure facing away from the base;
   a photoelectric sensing structure on a side of the package layer facing the base;
   at least one of a touch functional layer or a color filter layer on a side of the package layer facing away from the base, wherein the touch functional layer comprises a first metal layer structure, a touch insulation layer and a second metal layer structure stacked in a normal direction of a plane where the base is located, and the color filter layer comprises a black matrix; and
   a collimation light path structure on a side of the photoelectric sensing structure facing away from the base, the collimation light path structure comprising at least two light-blocking layers stacked in the normal direction of the plane where the base is located, wherein each of the at least two light-blocking layers has light-transmitting holes arranged in an array, and orthographic projections of the light-transmitting holes in different ones of the at least two light-blocking layers on the base at least partially coincide with each other, and the at least two light-blocking layers comprise at least one first light-blocking layer on a side of the package layer facing away from the base, and the at least one first light-blocking layer is disposed in the same layer as the first metal layer structure, the touch insulation layer, the second metal layer structure or the black matrix.

2. The display panel according to claim 1, wherein the light-emitting structure comprises a plurality of light-emitting elements, each light-emitting element comprises a first electrode, an organic functional layer and a second electrode stacked in the normal direction of the plane where the base is located, wherein the organic functional layer comprises at least a light-emitting layer; and
   the display panel further comprises:
   a driver circuit layer between the base and the light-emitting structure, the driver circuit layer comprising a first transistor electrically connected to the light-emitting element, wherein a drain of the first transistor is electrically connected to the first electrode in the light-emitting element corresponding to the first transistor.

3. The display panel according to claim 2, wherein the photoelectric sensing structure comprises at least one photoelectric sensor, each photoelectric sensor comprises a third electrode, a fourth electrode, and a photosensitive layer between the third electrode and the fourth electrode;
   the light-emitting element and the photoelectric sensor are located on a same side of the base, and the driver circuit layer further comprises a second transistor electrically connected to the photoelectric sensor, wherein a drain of the second transistor is electrically connected to the third electrode in the photoelectric sensor corresponding to the second transistor.

4. The display panel according to claim 2, further comprising:
   a planarization layer between the first electrode and the thin film transistor, wherein the first electrode is electrically connected to the drain of the first transistor, corresponding to the first electrode, through a via hole in the planarization layer; and
   a pixel defining layer on a side of the first electrode facing away from the base, wherein the pixel defining layer is provided therein with a plurality of pixel openings, and the light-emitting elements are located in the pixel openings.

5. The display panel according to claim 4, wherein the light-emitting element and the photoelectric sensor are located on a same side of the base, and a distance from a side surface of the light-emitting layer facing away from the base to the base is greater than or equal to a distance from a side surface of the photosensitive layer facing away from the base to the base.

6. The display panel according to claim 5, wherein the distance from the side surface of the photosensitive layer facing away from the base to the base is smaller than a distance from a side surface of the planarization layer facing away from the base to the base; and the at least two light-blocking layers further comprise at least one second light-blocking layer on a side of the package layer facing the base, wherein each of the at least one second light-blocking layer satisfies:

the pixel defining layer is made of a material comprising a black resin material, and the pixel defining layer also serves as the at least one second light-blocking layer;

or the first electrode is made of a metal material, and the at least one second light-blocking layer is disposed in the same layer as the first electrode;

or the planarization layer is made of a black resin material, and the planarization layer also serves as the at least one second light-blocking layer.

7. The display panel according to claim 5, wherein a plane where a side surface of the photosensitive layer facing away from the base is located is between the drain of the first transistor and the base;

the at least two light-blocking layers further comprise at least one second light-blocking layer on a side of the package layer facing the base, wherein each of the at least one second light-blocking layer satisfies:

the pixel defining layer is made of a material comprising a black resin material, and the pixel defining layer also serves as the at least one second light-blocking layer;

or the first electrode is made of a metal material, and the at least one second light-blocking layer is disposed in the same layer as the first electrode;

or the planarization layer is made of a black resin material, and the planarization layer also serves as the at least one second light-blocking layer;

or the drain of the first transistor is made of a metal material, and the at least one second light-blocking layer is disposed in the same layer as the drain of the first transistor.

8. The display panel according to claim 4, wherein the light-emitting structure and the photoelectric sensing structure are on opposite sides of the base.

9. The display panel according to claim 8, wherein the at least two light-blocking layers further comprise at least one second light-blocking layer on a side of the package layer facing the base, wherein each of the at least one second light-blocking layer satisfies:

the pixel defining layer is made of a material comprising a black resin material, and the pixel defining layer also serves as the at least one second light-blocking layer;

or the first electrode is made of a metal material, and the at least one second light-blocking layer is disposed in the same layer as the first electrode;

or the planarization layer is made of a black resin material, and the planarization layer also serves as the at least one second light-blocking layer;

or the drain of the first transistor is made of a metal material, and the at least one second light-blocking layer is disposed in the same layer as the drain of the first transistor.

10. The display panel according to claim 1, wherein the black matrix includes two layers stacked in the normal direction of the base.

11. The display panel according to claim 1, wherein the light-transmitting holes in the at least two light-blocking layers of the collimation light path structure have a same shape and a same aperture.

12. The display panel according to claim 11, wherein an orthographic projection of each light-transmitting hole in each of the at least two light-blocking layers on the base is completely coincident with an orthographic projection of the light-transmitting hole, corresponding to said each light-transmitting hole, in another light-blocking layer on the base.

13. The display panel according to claim 12, wherein the light-transmitting hole has an aperture D, and in the collimation light path structure, a distance from a side surface of one of the at least two light-blocking layers, closest to the base, facing the base to a side surface of another of the at least two light-blocking layers, farthest from the base, facing away from the base is H, and arctan (D/H) takes a value in a range of [10°, 20°].

14. The display panel according to claim 1, wherein each light-transmitting hole in each of the at least two light-blocking layers and the light-transmitting hole, corresponding to said each light-transmitting hole, in another light-blocking layer define a collimation light-transmitting channel; and the collimation light-transmitting channel has a collimation light-receiving angle in a range of [10°, 20°].

15. The display panel according to claim 1, wherein the number of the at least two light-blocking layers in the collimation light path structure is less than or equal to 4.

16. A display apparatus, comprising the display panel according to claim 1.

* * * * *